United States Patent
Song et al.

(10) Patent No.: US 11,234,337 B2
(45) Date of Patent: Jan. 25, 2022

(54) DISPLAY DEVICE

(71) Applicant: LG Display Co., Ltd., Seoul (KR)

(72) Inventors: JiHun Song, Seoul (KR); Hoiyong Kwon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/083,794

(22) Filed: Oct. 29, 2020

(65) Prior Publication Data
US 2021/0144868 A1 May 13, 2021

(30) Foreign Application Priority Data
Nov. 7, 2019 (KR) .......................... 10-2019-0141451

(51) Int. Cl.
*H05K 5/00* (2006.01)
(52) U.S. Cl.
CPC ......... *H05K 5/0026* (2013.01); *H05K 5/0017* (2013.01)
(58) Field of Classification Search
CPC ..... G09F 9/301; G06F 1/1652; H05K 5/0017; H05K 5/0217; H05K 5/0026
See application file for complete search history.

(56) References Cited

U.S. PATENT DOCUMENTS

| | | | |
|---|---|---|---|
| 9,684,340 B2 | 6/2017 | Han et al. | |
| 9,992,881 B2 * | 6/2018 | Choi | G06F 1/1652 |
| 2016/0231843 A1 * | 8/2016 | Kim | G06F 1/1652 |
| 2017/0031388 A1 * | 2/2017 | Han | G09G 3/3233 |
| 2017/0156219 A1 * | 6/2017 | Heo | H01L 51/0097 |
| 2017/0318688 A1 * | 11/2017 | Kim | G09F 9/301 |
| 2017/0318689 A1 | 11/2017 | Kim et al. | |
| 2017/0332478 A1 * | 11/2017 | Choi | H05K 1/028 |

(Continued)

FOREIGN PATENT DOCUMENTS

| | | |
|---|---|---|
| CN | 107369383 A | 11/2017 |
| CN | 110335546 A | 10/2019 |

(Continued)

OTHER PUBLICATIONS

Office Action and Search Report issued in corresponding TIPO Patent Application No. 10913880, dated Jun. 10, 2021.

(Continued)

*Primary Examiner* — Hung S. Bui
*Assistant Examiner* — Sagar Shrestha
(74) *Attorney, Agent, or Firm* — Morgan, Lewis & Bockius LLP

(57) ABSTRACT

A display device includes a display panel; a back cover supporting the display panel on a rear surface of the display panel; one or more flexible films electrically connected to one end of the display panel and on a surface of the back cover; a film cover covering the flexible films and the end of the display panel; a printed circuit board electrically connected to the flexible films and on the surface of the back cover; and a roller having a first flat portion, a second flat portion, and a curved portion. The display panel and the back cover are wound around or unwound from the roller. The end of the display panel is in line with the first flat portion while the printed circuit board is in line with the second flat portion when the display panel and the back cover are fully wound around the roller.

15 Claims, 15 Drawing Sheets

(56) References Cited

U.S. PATENT DOCUMENTS

| | | | |
|---|---|---|---|
| 2017/0332496 A1 | 11/2017 | Choi et al. | |
| 2018/0070466 A1 | 3/2018 | Kim et al. | |
| 2018/0070467 A1* | 3/2018 | Kim | H01L 51/0097 |
| 2020/0004296 A1 | 1/2020 | Lee et al. | |
| 2020/0008308 A1* | 1/2020 | Shin | G02F 1/133305 |
| 2021/0074189 A1* | 3/2021 | Kwon | G06F 1/1652 |

FOREIGN PATENT DOCUMENTS

| | | |
|---|---|---|
| EP | 3588243 A1 | 1/2020 |
| KR | 10-1966787 B1 | 4/2019 |
| KR | 10-1975188 B1 | 5/2019 |
| TW | 201805910 A | 2/2018 |
| WO | 2020065988 A1 | 4/2020 |

OTHER PUBLICATIONS

Extended European Search Report dated Mar. 26, 2021, issued in corresponding European Patent Application No. 20204024.2.
Decision to Grant in counterpart Japanese Patent Application No. 2020-185621 dated Aug. 17, 2021.

* cited by examiner

DISPLAY DEVICE

CROSS-REFERENCE TO RELATED APPLICATIONS

This application claims priority to Korean Patent Application No. 10-2019-0141451 filed in the Korean Intellectual Property Office on Nov. 7, 2019, the disclosure of which is incorporated herein by reference in its entirety as if fully set forth herein.

BACKGROUND

Technical Field

The present disclosure relates to a display device, and more particularly to a rollable display device that can display images even when it is rolled.

Discussion of the Related Art

Display devices employed by the monitor of a computer, a TV, a mobile phone or the like include an organic light-emitting display (OLED) that emits light by itself, and a liquid-crystal display (LCD) that requires a separate light source.

Such display devices find more and more applications, including computer monitors and televisions, as well as personal portable devices. Accordingly, research is ongoing to develop display devices having a larger display area with reduced volume and weight.

In addition, a rollable display device is attracting attention as the next generation display device. Such a rollable display device is fabricated by forming display elements and lines on a flexible substrate made of a flexible material such as plastic so that it is able to display images even if it is rolled.

SUMMARY

Accordingly, embodiments of the present disclosure are directed to a display device that substantially obviates one or more of the problems due to limitations and disadvantages of the related art.

An object of the present disclosure is to provide a display device that can reduce damage to a flexible film and a printed circuit board due to repetitive winding and unwinding.

Another object of the present disclosure is to provide a display device that can reduce stress applied to a display panel by keeping a pad area of a display panel flat whether the display device is wound or unwound.

Still another object of the present disclosure is to provide a display device that can suppress delamination between a flexible film and a display panel when the display device is wound around a roller.

Still another object of the present disclosure is to provide a display device that can reduce external force acting on a flexible film when the display device is wound around a roller.

Yet another object of the present disclosure is to provide a display device that can effectively release heat generated in a driver IC of a flexible film.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises: a display panel; a back cover supporting the display panel on a rear surface of the display panel; one or more flexible films electrically connected to one end of the display panel and disposed on a surface of the back cover; a film cover covering the one or more flexible films and the end of the display panel; a printed circuit board electrically connected to the one or more flexible films and disposed on the surface of the back cover; and a roller comprising a first flat portion, a second flat portion and a curved portion. The display panel and the back cover are wound around or unwound from the roller. The end of the display panel is disposed in line with the first flat portion while the printed circuit board is disposed in line with the second flat portion when the display panel and the back cover are fully wound around the roller. Accordingly, the end of the display panel to which at least one flexible film is bonded remains flat all the time, so that damage to the at least one flexible film and the display panel can be reduced while the display device is wound or unwound.

In another aspect, a display device comprises: a display panel comprising a pad area; one or more flexible films electrically connected to the pad area on a surface of the display panel; a printed circuit board electrically connected to the one or more flexible films; a back cover supporting the display panel, the one or more flexible films and the printed circuit board; a film cover covering at least a part of the pad area and the one or more flexible films on an opposite surface of the display panel; a cover unit in which the printed circuit board and a part of the back cover overlapping the printed circuit board are inserted; and a roller comprising a first flat portion in line with the pad area and a second flat portion in line with the printed circuit board and extended from the first flat portion, wherein the display panel and the back cover are wound around or unwound from the roller. Accordingly, the pad area is wound on the first flat portion, so that a contact failure between the pad area and one or more flexible films can be reduced.

Other detailed matters of the exemplary embodiments are included in the detailed description and the drawings.

According to an exemplary embodiment of the present disclosure, it is possible to reduce damage to a flexible film and a printed circuit board while a display device is wound or unwound.

According to an exemplary embodiment of the present disclosure, it is possible to reduce damage to a display panel including at least a pad area by keeping a portion of the display panel flat all the time.

According to an exemplary embodiment of the present disclosure, it is possible to reduce tension applied to a flexible film while a display device is wound and unwound.

According to an exemplary embodiment of the present disclosure, it is possible to reduce contact failure between a flexible film and a display panel while a display device is wound and unwound.

According to an exemplary embodiment of the present disclosure, it is possible to efficiently release heat generated in driver ICs of flexible films.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1A:
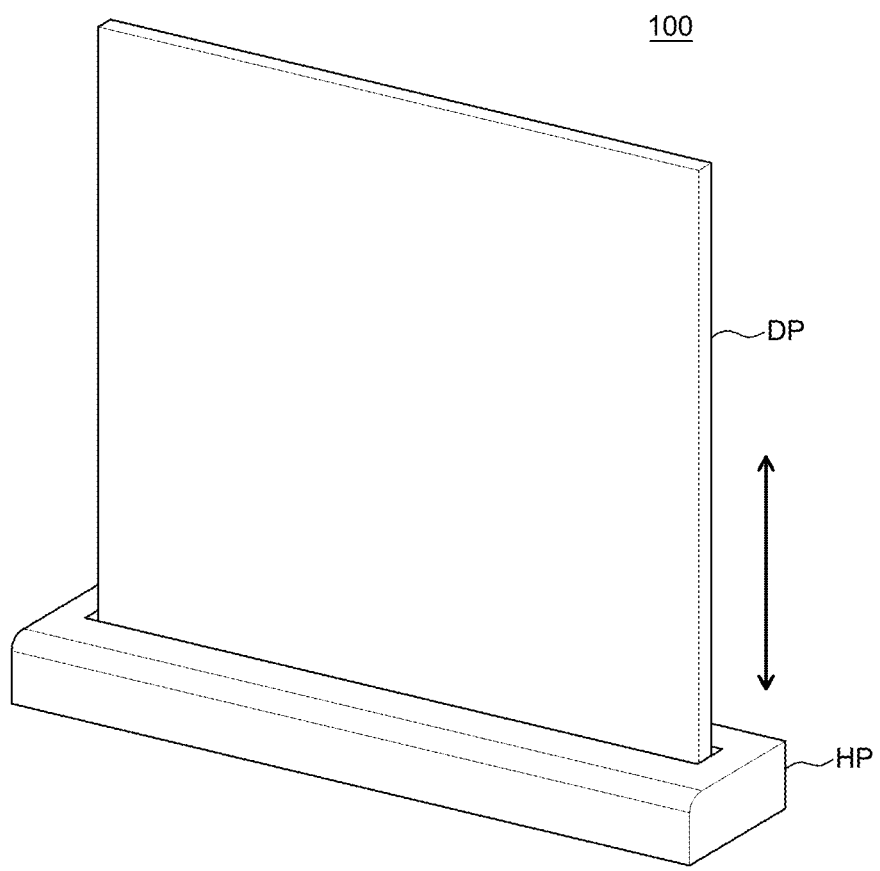
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a rollable display device according to exemplary embodiments of the present disclosure will be described in detail with reference to accompanying drawings.

<Display Device—Rollable Display Device>

A rollable display device may be referred to as a display device capable of displaying images even when it is rolled. A rollable display device may have higher flexibility than existing typical display devices. Depending on whether a rollable display device is in use or not, the shape of the rollable display device may be changed as desired. Specifically, when the rollable display device is not used, the rollable display device may be rolled to reduce the volume for storage. On the other hand, when the rollable display device is used, the rolled rollable display device may be unfolded for use.

Figure 1B:
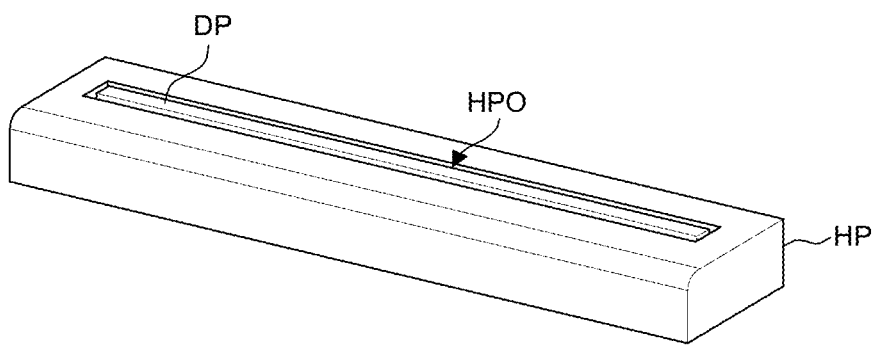

FIGS. 1A and 1B are perspective views of a display device according to an exemplary embodiment of the present disclosure. Referring to FIGS. 1A and 1B, a display device 100 according to an exemplary embodiment of the present disclosure includes a display unit DP and a housing unit HP.

The display unit DP is an element for displaying images to a user. For example, a display element, circuitry for driving the display element, wiring lines and components may be disposed in the display unit DP. Since the display device 100 according to the exemplary embodiment of the present disclosure is a rollable display device, the display unit DP may be able to be wound or unwound. For example, the display unit DP may include a display panel and a back cover having flexibility to allow winding or unwinding. The display unit DP will be described in more detail later with reference to FIGS. 4 to 8.

The housing unit HP is a case in which the display unit DP can be accommodated. The display unit DP may be wound and accommodated inside the housing unit HP, and the display unit DP may be unwound and disposed outside the housing unit HP.

The housing unit HP has an opening HPO so that the display unit DP can move inside and outside the housing unit HP. The display unit DP may move in the vertical direction through the opening HPO of the housing unit HP.

In addition, the display unit DP of the display device 100 may be switched between a full-unwinding state and a full-winding state.

FIG. 1A shows the fully-unwinding state of the display unit DP of the display device 100, in which the display unit DP of the display device 100 is disposed outside the housing unit HP. That is to say, in order for a user to watch images on the display device 100, the display unit DP is fully unwound until it can no longer be unwound and disposed outside the housing unit HP.

FIG. 1B shows the fully-winding state of the display unit DP of the display device 100, in which the display unit DP of the display device 100 is disposed inside the housing unit HP. That is to say, when the user does not watch images on the display device 100, it is advantageous in terms of appearance that the display unit DP is not disposed outside the housing unit HP. Therefore, the display unit DP is wound and is accommodated inside the housing unit HP, which may be defined as the fully-winding state. In addition, when the display unit DP is in the fully-winding state where it is accommodated in the housing unit HP, the volume of the display device 100 can be reduced and thus it is easier to carry.

A driving unit MP is disposed for winding or unwinding the display unit DP to switch between the fully-unwinding state and the fully-winding state.

<Driving Unit>

Figure 2:
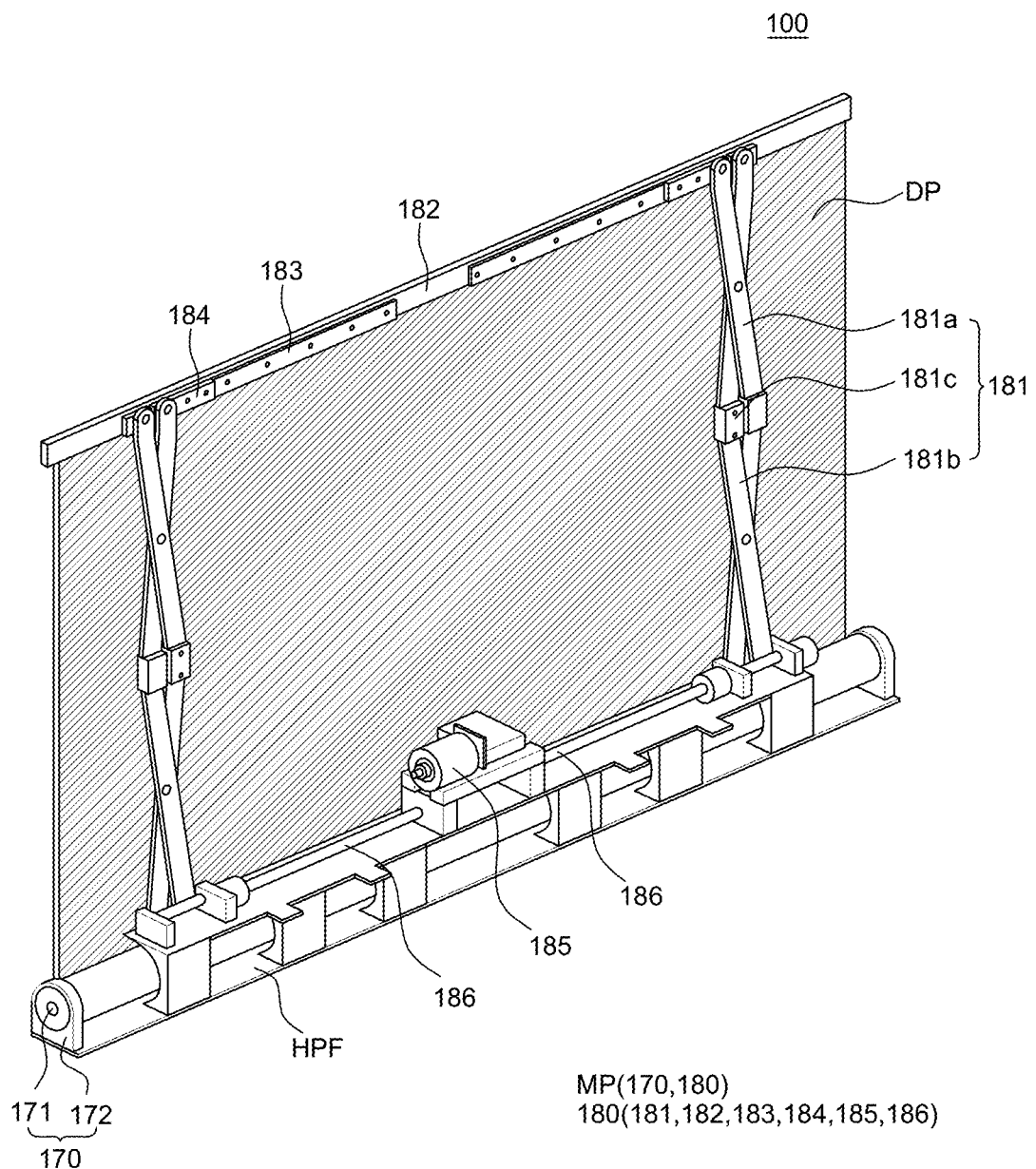
FIG. 2 is a perspective view of a display device according to an exemplary embodiment of the present disclosure.
Figure 3:
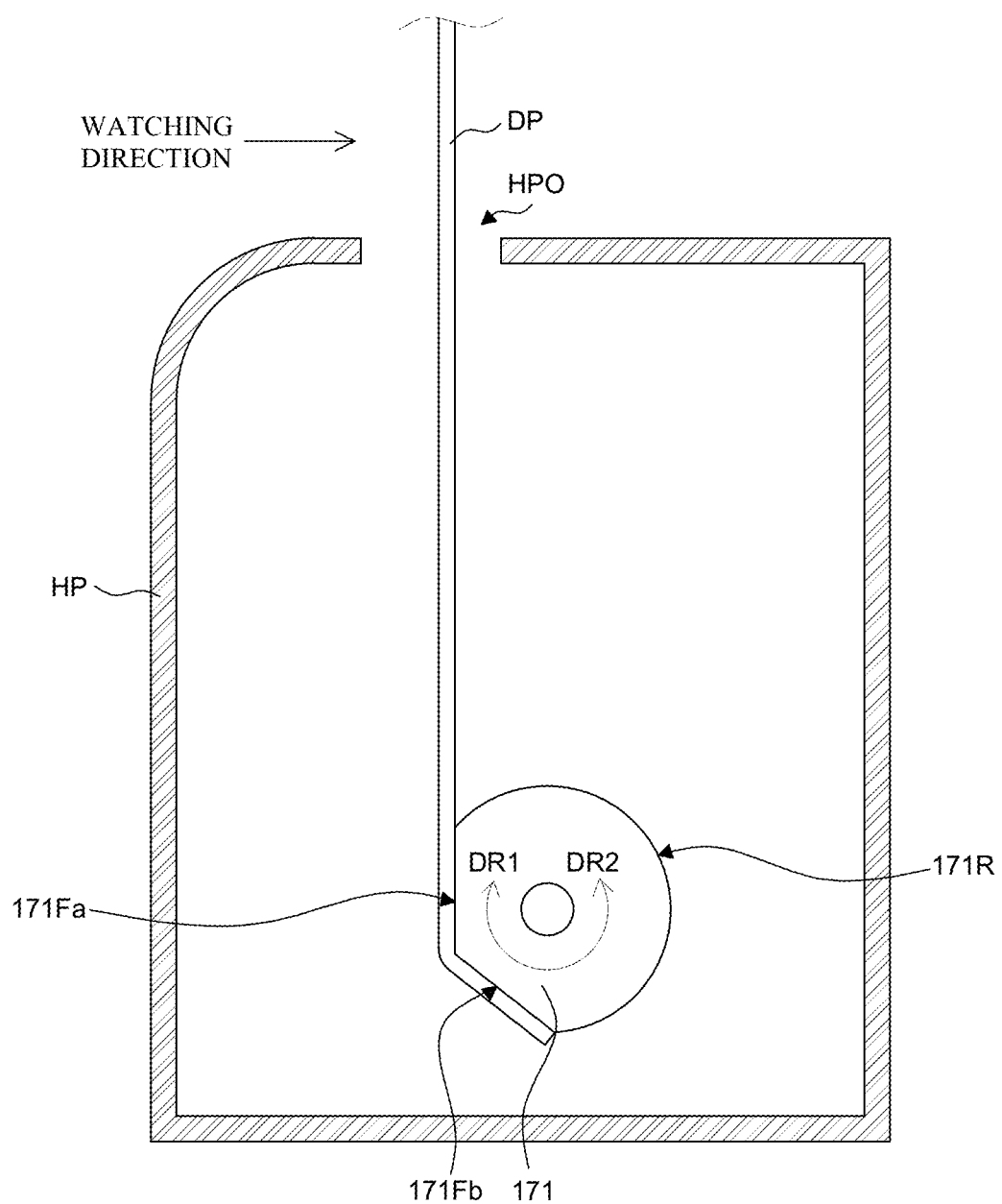
FIG. 3 is a schematic cross-sectional view of a display device according to an exemplary embodiment of the present disclosure.

FIG. 2 is a perspective view of a display device according to an exemplary embodiment of the present disclosure. FIG. 3 is a schematic cross-sectional view of a display device according to an exemplary embodiment of the present disclosure. FIG. 3 is a schematic cross-sectional view for illustrating a roller 171 and a display unit DP of a display device 100 according to an exemplary embodiment of the present disclosure. For convenience of illustration, FIG. 3 shows only the housing unit HP, the roller 171 and the display unit DP.

First, referring to FIG. 2, the driving unit MP includes a roller unit 170 and a lifting unit 180.

The roller unit 170 rotates clockwise or counterclockwise while the display unit DP fixed to the roller unit 170 is wound around or unwound from it. The roller unit 170 includes a roller 171 and roller supports 172.

The roller 171 is a member around which the display unit DP is wound. The roller 171 may be formed in a cylindrical shape, for example. The lower edge of the display unit DP may be fixed to the roller 171. When the roller 171 rotates, the display unit DP having its lower edge fixed to the roller 171 may be wound around the roller 171. When the roller 171 rotates in the opposite direction, the display unit DP wound around the roller 171 may be unwound from the roller 171.

Referring to FIG. 3, the roller 171 may be formed in a cylindrical shape with a flat surface along a length direction of the roller 171. At least a part of the outer circumferential surface of the cylindrical shape may be formed as a flat surface, and the rest part of the outer circumferential surface of the cylindrical shape may be formed as a curved surface.

The roller 171 may be formed generally in a cylindrical shape, with a part of it formed as a flat surface. That is to say, a part of the outer circumferential surface of the roller 171 may be formed as a flat surface, and the rest part of the outer circumferential surface thereof may be formed as a curved surface. For example, the roller 171 may include a curved portion 171R, a first flat portion 171Fa a second flat portion 171Fb. A pad area of the display panel of the display unit DP and the printed circuit board may be seated on the first flat portion 171Fa and the second flat portion 171Fb of the roller 171, respectively. It is, however, to be noted that the roller 171 may be formed in a complete cylindrical shape or in any shape as long as the display unit DP can be wound around it.

Referring back to FIG. 2, the roller supports 172 support the roller 171 on both sides of the roller 171. Specifically, the roller support 172 is disposed on the floor HPF of the housing unit HP. The upper ends of the roller supports 172 are coupled with both ends of the roller 171, respectively. Thus, the roller supports 172 may support the roller 171 so that the roller 171 is spaced apart from the floor HPF of the housing unit HP. The roller 171 may be coupled to the roller supports 172 so that it can rotate.

The lifting unit 180 moves the display unit DP in the vertical direction in accordance with the driving of the roller unit 170. The lifting unit 180 includes link units 181, a head bar 182, slide rails 183, sliders 184, a motor 185, and rotors 186.

Each of the link units 181 of the lifting unit 180 includes a plurality of links 181a and 181b and a hinge 181c connecting between the links 181a and 181b. Specifically, the plurality of link 181a and 181b includes a first link 181a and a second link 181b, and the first link 181a and the second link 181b cross each other in a scissor shape and are rotatably engaged via the hinge 181c. Accordingly, when the link unit 181 moves in the vertical direction, the links 181a and 181b may rotate in a direction that is moved away from or closer to each other.

The head bar 182 of the lifting unit 180 is fixed to the top end of the display unit DP. The head bar 182 may be connected to the link unit 181 and may move the display unit DP in the vertical direction according to the rotation of the plurality of links 181a and 181b of the link unit 181. In other words, the display unit DP may be moved in the vertical direction by the head bar 182 and the link unit 181.

The head bar 182 covers only a part of the surface adjacent to the top edge of the display unit DP so as not to hide the images displayed on front face of the display unit DP. The display unit DP and the head bar 182 may be fixed with, but is not limited to, screws.

The slide rails 183 of the lifting unit 180 provide movement paths of the plurality of links 181a and 181b. A part of the links 181a and 181b is rotatably fastened to the slide rails 183, so that movement can be guided along the trajectory of the slide rails 183. A part of the links 181a and 181b may be fastened to the sliders 184 that are movable along the slide rails 183, so that they can move along the trajectory of the slide rails 183.

The motor 185 may be connected to a power generator such as a separate external power supply or a built-in battery to receive power. The motor 185 generates a rotational force to provide a driving force to the rotors 186.

The rotators 186 are connected to the motor 185 and are configured to convert rotational motion from the motor 185 into linear reciprocating motion. That is to say, the rotational motion of the motor 185 can be converted into a linear reciprocating motion of the structure fixed to the rotators 186. For example, the rotators 186 may be implemented as, but is not limited to, a shaft and a ball screw including a nut fastened to the shaft.

The motor 185 and the rotors 186 may be interlocked with the link units 181 to elevate the display unit DP. The link units 181 are formed in a link structure and receive the driving force from the motor 185 and the rotors 186 to repeatedly perform folding or unfolding operations.

Specifically, when the display unit DP is wound, the motor 185 is driven, and accordingly the structure of the rotors 186 may perform a linear motion. That is to say, a part of the rotors 186 to which one end of the second link 181b is connected may perform linear motion. As a result, one end of the second link 181b may move toward the motor 185, and the plurality of links may be folded, so that the height of the link units 181 may be reduced. In addition, in the course that the links are folded, the head bar 182 connected to the first link 181a also descends, and one end of the display unit DP connected to the head bar 182 also descends.

When the display unit DP is unwound, the motor 185 is driven, and accordingly the structure of the rotors 186 may perform a linear motion. That is to say, a part of the rotors 186 to which one end of the second link 181b is connected may perform linear motion. Accordingly, one end of the second link 181b may move away from the motor 185, and the plurality of links may be unfolded, so that the height of the link units 181 may be increased. In addition, in the course that the links 181a and 181b are unfolded, the head bar 182 connected to the first link 181a also ascends, and one end of the display unit DP connected to the head bar 182 also ascends.

Accordingly, when the display unit DP is fully wound around the roller 171, the link units 181 of the lifting unit 180 remains folded. That is to say, when the display unit DP is fully wound around the roller 171, the lifting unit 180 may have the lowest height. When the display unit DP is fully unwound, the link units 181 of the lifting unit 180 remains unfolded. That is to say, when the display unit DP is fully unwound, the lifting unit 180 may have the highest height.

When the display unit DP is wound, the roller 171 may rotate and the display unit DP may be wound around the roller 171. For example, referring to FIG. 3, the lower edge of the display unit DP is connected to the roller 171. When the roller 171 rotates in a second direction DR2, i.e., counterclockwise, the rear surface of the display unit DP may be in tight contact with the surface of the roller 171 so that the display unit DP can be wound around it.

When the display unit DP is unwound, the roller 171 may rotate and the display unit DP may be unwound from the roller 171. For example, referring to FIG. 3, when the roller 171 rotates in the first direction DR1, i.e., clockwise, the display unit DP may be unwound from the roller 171 and may be disposed outside the housing unit HP.

In some exemplary embodiments, the driving unit MP having other structure than that of the above-described driving unit MP may be employed by the display device 100. The configurations of the roller unit 170 and the lifting unit 180 may be altered, some of the configurations may be omitted or other configurations may be added, as long as the display unit DP can be wound and unwound.

<Display Unit>

Figure 4:
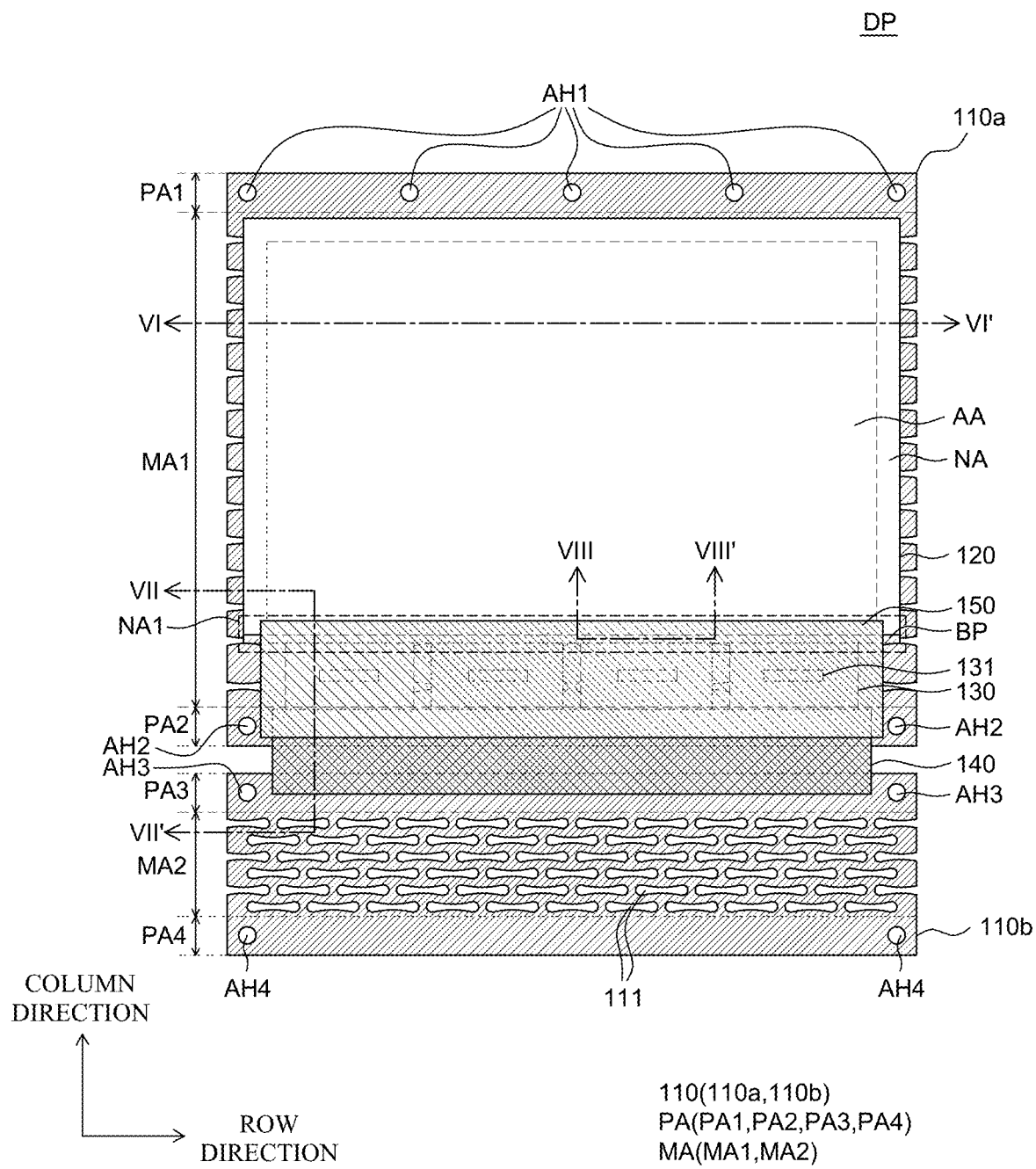
FIG. 4 is a plan view of a display unit of a display device according to an exemplary embodiment of the present disclosure.
Figure 5:
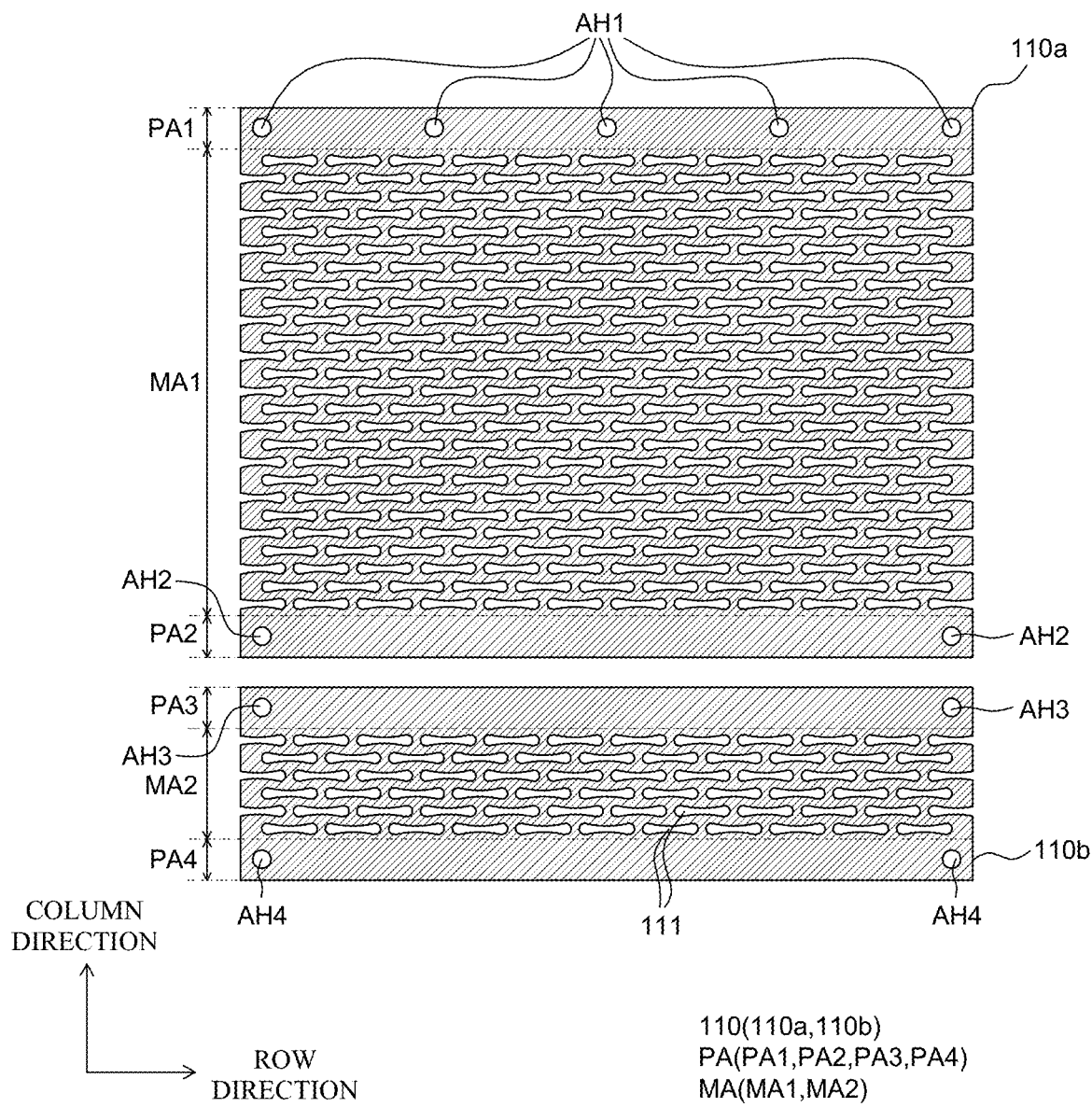
FIG. 5 is a plan view of a back cover of a display device according to an exemplary embodiment of the present disclosure.
Figure 6:
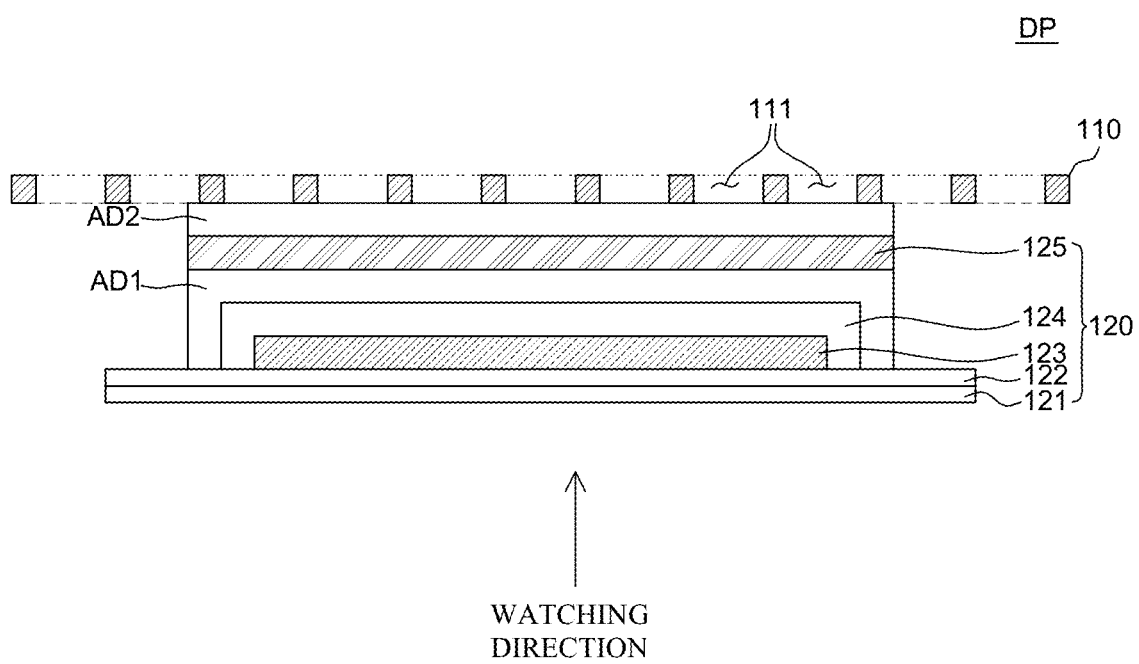
FIG. 6 is a cross-sectional view taken along line VI-VI' of FIG. 4.
Figure 7:
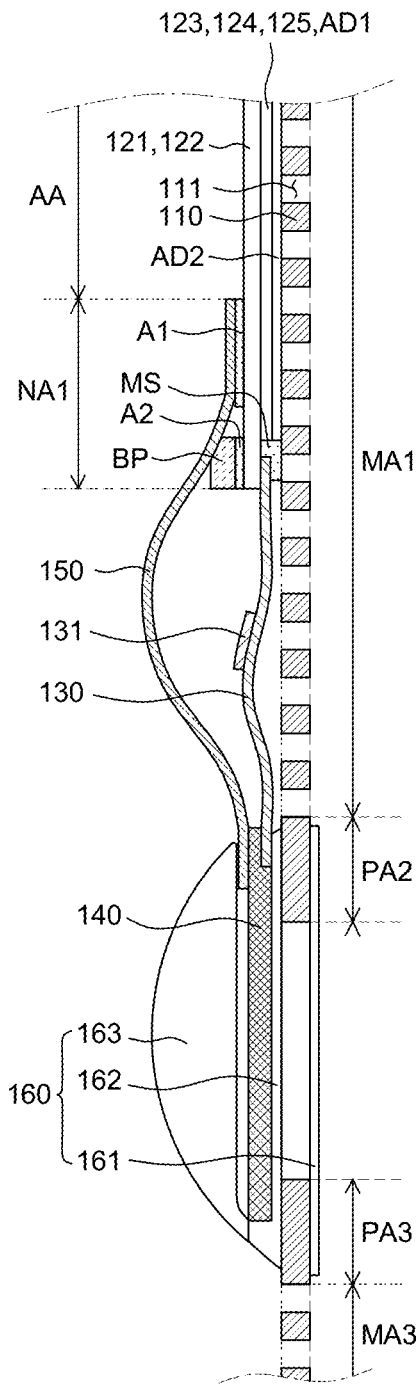
FIG. 7 is a cross-sectional view taken along line VII-VII' of FIG. 4.
Figure 8:
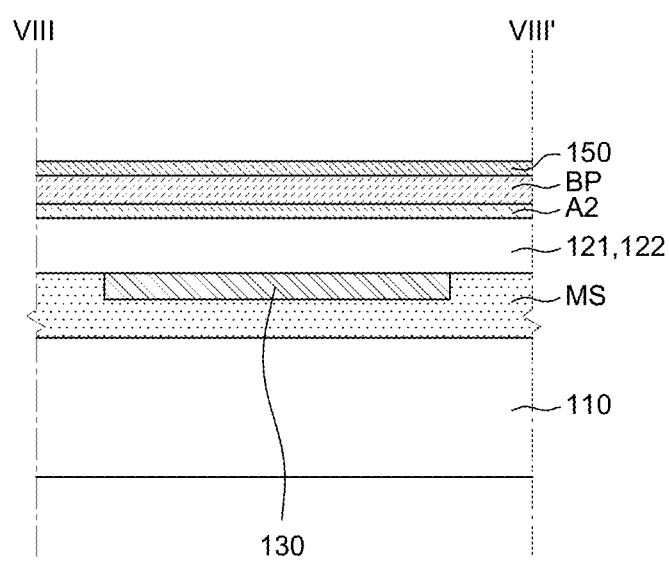
FIG. 8 is a cross-sectional view taken along line VIII-VIII' of FIG. 4.

FIG. 4 is a plan view of a display unit of a display device according to an exemplary embodiment of the present disclosure. FIG. 5 is a plan view of a back cover of a display device according to an exemplary embodiment of the present disclosure. FIG. 6 is a cross-sectional view taken along line VI-VI' of FIG. 4. FIG. 7 is a cross-sectional view taken along line VII-VII' of FIG. 4. FIG. 8 is a cross-sectional view taken along line VIII-VIII' of FIG. 4. Referring to FIGS. 4 to 8, the display unit DP includes a back cover 110, a display panel 120, at least one flexible film 130, a printed circuit board 140, a film cover 150, a cover unit 160, a buffer pad BP, a first adhesive member A1, a second adhesive member A2, and a micro-seal member MS. For convenience of illustration, the cover unit 160 is not depicted in FIG. 4. The substrate 121 and the buffer layer 122 are depicted as a single layer, the pixel portion 123, the encapsulation layer 124, the first adhesive layer AD1 and the encapsulation substrate 125 are depicted as a single layer in FIG. 7.

Referring to FIGS. 4 and 5, the back cover 110 may be disposed on the rear surface of the display panel 120 to support the display panel 120, at least one flexible film 130 and the printed circuit board 140. The back cover 110 may be larger than the display panel 120. The back cover 110 can protect other elements of the display unit DP from the outside.

Although the back cover 110 is made of a material having rigidity, at least a part of the back cover 110 may have flexibility so that it can be wound around or unwound from the roller 171 together with the display panel 120. For example, the back cover 110 may be made of a metal material such as steel use stainless (SUS) and Invar, or a material such as plastic. It is to be noted that the material of the back cover 110 may be changed as long as the material satisfies the physical property conditions such as the amount of thermal deformation, the radius of curvature and the strength depending on the design choice.

The back cover 110 includes a first back cover 110a and a second back cover 110b. The back cover 110 may be separated into the first back cover 110a and the second back cover 110b. The first back cover 110a may be fastened to the head bar 182, and the second back cover 110b may be fastened to the roller 171.

The back cover 110 may include a plurality of support areas PA and a plurality of malleable areas MA. In the plurality of support areas PA, no opening 111 is formed. In the plurality of malleable areas MA, a plurality of openings 111 is formed. Specifically, the first back cover 110a includes a first support area PA1, a first malleable area MA1 and a second support area PA2 stacked on one another in this order from the top. The second back cover 110b includes a third support area PA3, a second malleable area MA2 and a fourth support area PA4 stacked on one another in this order from the top. In addition, a plurality of fastening holes is formed in each of the plurality of support areas PA. Specifically, first fastening holes AH1 are formed in the first support area PA1, second fastening holes AH2 are formed in the second support area PA2, third fastening holes AH3 are formed in the third support area PA3, and fourth fastening holes AH4 are formed in the fourth support area PA4.

The first support area PA1 is the uppermost area of the first back cover 110a and is fastened to the head bar 182. First fastening holes AH1 may be formed in the first support area PA1 for fastening to the head bar 182. For example, the head bar 182 may be fastened to the first support area PA1 of the back cover 110 by screws penetrating the hear bar 182 and the first fastening holes AH1. As the first support area PA1 is fastened to the head bar 182, when the link units 181 fastened to the head bar 182 are elevated or lowered, the back cover 110 may also be elevated or lowered together. In addition, the display panel 120 attached to the back cover 110 may also be elevated or lowered together.

The first malleable area MA1 is extended from the first support area PA1 toward the lower side of the first back cover 110a. In the first malleable area MA1, a plurality of openings 111 is arranged and the display panel 120 is attached. Specifically, the first malleable area MA1 may be wound around or unwound from the roller 171 together with the display panel 120. The first malleable area MA1 may overlap at least the display panel 120 among the other elements of the display unit DP.

The second support area PA2 is extended from the first malleable area MA1 toward the lower side of the first back cover 110a. The second support area PA2 is fastened to a base plate 161 and a bottom plate 162 of the cover unit 160. Second fastening holes AH2 may be formed in the second support area PA2 for fastening to the cover unit 160. For example, screws penetrating through the cover unit 160 and the second fastening holes AH2 are disposed, so that the cover unit 160 and the second support area PA2 of the first back cover 110a can be fastened to each other.

The third support area PA3 is the uppermost area of the second back cover 110b and is fastened to the base plate 161 and the bottom plate 162 of the cover unit 160. Third fastening holes AH3 may be formed in the third support area PA3 for fastening to the cover unit 160. For example, screws penetrating through the cover unit 160 and the third fastening holes AH3 are disposed, so that the cover unit 160 and the third support area PA3 of the second back cover 110b can be fastened to each other.

The first back cover 110a and the second back cover 110b may be connected to each other by the cover unit 160. For example, a projections from the base plate 161 or a projections from the bottom plate 162 are inserted into the second fastening holes AH2 of second support area PA2 of the first back cover 110a and the third fastening holes AH3 of the third support area PA3 of the second back cover 110b, so that the first back cover 110a and the second back cover 110b can be coupled with each other. In addition, for example, screws penetrating through the first back cover 110a, the second back cover 110b and the cover unit 160 are disposed so that the cover unit 160 can be coupled with the first back cover 110a and the second back cover 110b. It is to be noted that the first back cover 110a, the second back cover 110b and the cover unit 160 may be coupled with one another in a variety of ways.

The second malleable area MA2 is extended from the third support area PA3 toward the lower side of the second back cover 110b. In the second malleable area MA2, a plurality of openings 111 is formed. The second malleable area MA2 is extended such that a display area AA of the display panel 120 can be disposed outside the housing unit HP. For example, when the back cover 110 and the display panel 120 are fully unwound, the second back cover 110b fixed to the roller 171 and a part of the first malleable area MA1 where at least one flexible film 130 may be disposed may be disposed inside the housing unit HP, whereas the other part of the first malleable area MA1 having the display panel 120 attached thereto and the first support area PA1 may be disposed outside the housing unit HP. Specifically, the fourth support area PA4, the second malleable area MA2 and the third support area PA3, the second support area PA2 and a part of the first malleable area MA1 may be disposed inside the housing unit HP. If the length from the fourth support area PA4 fixed to the roller 171 to the part of the first malleable area MA1 is smaller than the length from the fourth support area PA4 to the opening HPO of the housing unit HP, a part of the display panel 120 is disposed inside the housing unit HP, and thus a part of images displayed on the display panel 120 may not be seen. Therefore, the display device 100 may be designed so that the length of the area including the entire second back cover 110b fixed to the roller 171, the second support area PA2 and the part of the first malleable area MA1 is equal to the length from the fourth support area PA4 fixed to the roller 171 to the opening HPO of the housing unit HP.

The fourth support area PA4 is extended from the second malleable area MA2 toward the lower side of the second back cover 110b. The fourth support area PA4 is the lowermost area of the second back cover 110b and is fastened to the roller 171. The fourth fastening holes AH4 may be formed in the fourth support area PA4 for fastening to the roller 171. For example, screws penetrating through the roller 171 and the fourth fastening holes AH4 are disposed, so that the roller 171 and the fourth support area PA4 of the second back cover 110b can be fastened to each other. As the fourth support area PA4 is fastened to the roller 171, the back cover 110 may be wound around or unwound from the roller 171.

It is to be noted that the plurality of openings 111 formed in the plurality of malleable areas MA is not formed in the first support area PA1, the second support area PA2, the third support area PA3 and the fourth support area PA4. Specifically, in each of the first support area PA1, the second support area PA2, the third support area PA3 and the fourth support area PA3, only the first fastening holes AH1, the second fastening holes AH2, the third fastening holes AH3 and the fourth fastening holes AH4 are formed and openings like the openings 111 formed in the malleable areas MA are not formed. In addition, the first fastening holes AH1, the second fastening holes AH2, the third fastening holes AH3 and the fourth fastening holes AH4 have different shapes from the shape of the plurality of openings 111. The first support area PA1 may be fixed to the head bar 182. The second support area PA2 and the third support area PA3 may be connected to the cover unit 160. The fourth support area PA4 may be fixed to the roller 171. The plurality of support areas PA may be more rigid than the plurality of malleable areas MA.

As the first support area PA1, the second support area PA2, the third support area PA3 and the fourth support area PA4 have rigidity, the first support area PA1 and the fourth support area PA4 may be firmly fixed to the head bar 182 and the roller 171, and the second support area PA2 and the third support area PA3 may be firmly fixed to the cover unit 160. Therefore, the display unit DP is fixed to the roller 171 and the head bar 182 of the driving unit MP, and thus it may move into or out of the housing unit HP according to the operation of the driving unit MP.

Although the plurality of support areas PA and the plurality of malleable areas MA of the back cover 110 are sequentially arranged along the column direction in the example shown in FIG. 4 as an example, the plurality of support areas PA and the plurality of malleable areas MA may be arranged along the row direction when the back cover 110 is wound in the row direction.

Although the five first fastening holes AH1, the two second fastening holes AH2, the two third fastening holes AH3 and the two fourth fastening holes AH4 are shown in FIGS. 4 and 5, the numbers of the first fastening holes AH1, the second fastening holes AH2, the third fastening holes AH3 and the fourth fastening holes AH4 are not limited thereto. Although the back cover 110 is fastened to the head bar 182 using the first fastening holes AH1, is fastened to the cover unit 160 using the second fastening holes AH2 and the third fastening holes AH3, and is fastened to the roller 171 using the fourth fastening holes AH4 in the example shown in FIG. 4, the present disclosure is not limited thereto. The back cover 110, the head bar 182, the roller 171 and the cover unit 160 may be fastened to one another without separate fastening holes.

When the display unit DP is wound or unwound, the openings 111 formed in the malleable areas MA of the back cover 110 may be deformed due to the stress applied to the display unit DP. Specifically, when the display unit DP is wound or unwound, the malleable areas MA of the back cover 110 may be deformed as the openings 111 contract or expand. As the openings 111 contract or expand, it is possible to suppress the display panel 120 disposed on the malleable areas MA of the back cover 110 from slipping, and the stress applied to the display panel 120 can be reduced.

When the display panel 120 and the back cover 110 are wound around the roller 171, due to the difference in the radius of curvature between the display panel 120 and the back cover 110, there is a difference in the length between the display panel 120 and the back cover 110 which are wound around the roller 171. For example, the length of the back cover 110 when it is wound around the roller 171 once may be different from the length of the display panel 120 when it is wound around the roller 171 once. Specifically, since the display panel 120 is disposed more to the outside of the roller 171 than the back cover 110, the length of the display panel 120 when it is wound around once the roller 171 may be larger than the length of the back cover 110 when it is wound around once the roller 171. As such, when the display unit DP is wound, there is a difference in the length between the back cover 110 and the display panel 120 wound around the roller 171 due to the difference in the radius of curvature. As a result, the display panel 120 attached to the back cover 110 may slide and deviate from its original position. As used herein, a phenomenon that the display panel 120 slips from the back cover 110 due to a difference in the radius of curvature and stress caused by winding may be defined as a slip phenomenon. If the slip is excessively large, the display panel 120 may be detached from the back cover 110, or defects such as cracks may occur.

In the display device 100 according to an exemplary embodiment of the present disclosure, even if stress is applied to the display unit DP while the display unit DP is wound or unwound, the plurality of openings 111 of the back cover 110 can be deformed flexibly so that the stress applied to the back cover 110 and the display panel 120 can be relieved. For example, when the back cover 110 and the display panel 120 are wound around the roller 171 in the column direction, stress may be applied which deforms the back cover 110 and the display panel 120 in the vertical direction. When this happens, the plurality of openings 111 of the back cover 110 may be expanded in the vertical direction of the back cover 110, and the length of the back cover 110 may be flexibly deformed. As a result, the difference in the length between the back cover 110 and the display panel 120 due to the difference in the radius of curvature in the course of winding the back cover 110 and the display panel 120 can be compensated for by the plurality of openings 111 of the back cover 110. In addition, the openings 111 are deformed while the back cover 110 and the display panel 120 are wound, so that stress applied from the back cover 110 to the display panel 120 can also be relieved.

Referring to FIGS. 4 and 6, the display panel 120 is disposed on a surface of the back cover 110. On a surface of the first back cover 110a, the display panel 120 is disposed in the first malleable area MA1. The display panel 120 is a panel for displaying images to a user. In the display panel 120, a display element for displaying images, a driving element for driving the display element, lines for transmitting various signals to the display element and the driving element, etc. may be disposed.

The display element may be defined differently depending on the type of the display panel 120. For example, in the case that the display panel 120 is the organic light-emitting display panel, the display element may be an organic light-emitting element including an anode, an organic light-emitting layer, and a cathode. For example, when the display panel 120 is a liquid-crystal display panel, the display element may be a liquid-crystal display element. In the following description, the display panel 120 is described as an organic light-emitting display panel. It is, however, to be understood that the display panel 120 is not limited to the organic light-emitting display panel. As the display device 100 according to the exemplary embodiment of the present disclosure is a rollable display device, the display panel 120 may be implemented as a flexible display panel in order to be wound around or unwound from the roller 171.

Referring to FIG. 4, the display panel 120 includes a display area AA and a non-display area NA.

In the display area AA, images are displayed on the display panel 120. A plurality of sub-pixels forming each of a plurality of pixels and driver circuits for driving the sub-pixels may be disposed in the display area AA. The plurality of sub-pixels is the minimum units formed the display area AA. A display element may be disposed in each of the plurality of sub-pixels. For example, an organic light-emitting element including an anode, an organic light-emitting layer, and a cathode may be disposed in each of the plurality of sub pixels. It is, however, to be understood that the present disclosure is not limited thereto. In addition, driving elements, lines etc. may be included in the driving circuitry for driving a plurality of sub-pixels. For example, the driver circuits may be formed of, but is not limited to, thin-film transistors, storage capacitors, gate lines, data lines, etc.

In the non-display area NA, no image is displayed. In the non-display area NA, a variety of wiring lines and circuits for driving the organic light-emitting elements in the display area AA, etc. may be disposed. For example, in the non-display area NA, link lines for transmitting signals to the sub-pixels and the driver circuits of the display area AA, or driver ICs such as a gate driver IC and a data driver IC, etc. may be disposed. It is, however, to be understood that the present disclosure is not limited thereto.

The non-display area NA includes a pad area NA1. In the pad area NA1, a plurality of pads is disposed. The pad area NA1 may be a part of the non-display area NA at an end of the display panel 120. The pads are electrodes for electrically connecting the at least one flexible film 130 with the display panel 120. The at least one flexible film 130 and the display panel 120 can be electrically connected with each other through the pads. It is to be noted that the pad area NA1 may be formed on another portion of the non-display area NA depending on the location of the flexible film 130.

Referring to FIG. 6, the display panel 120 includes the substrate 121, the buffer layer 122, the pixel portion 123, the encapsulation layer 124, and the encapsulation substrate 125.

The substrate 121 is a base member for supporting various elements of the display panel 120 and may be made of an insulating material. The substrate 121 may be made of a material having flexibility to allow the display panel 120 to be wound or unwound. For example, the substrate 121 may be made of a plastic material such as polyimide (PI).

The buffer layer 122 is disposed on the upper surface of the substrate 121. The buffer layer 122 can prevent diffusion of moisture and/or oxygen that has permeated from the outside of the substrate 121. The buffer layer 122 may be made of an inorganic material, and may be made up of, for example, a single layer of silicon oxide (SiOx) or silicon nitride (SiNx) or multiple layers thereof. It is, however, to be understood that the present disclosure is not limited thereto.

The pixel portion 123 is disposed on the substrate 121 and the buffer layer 122. The pixel portion 123 includes a plurality of organic light-emitting elements and circuitry for driving the organic light-emitting elements. The pixel portion 123 may fall in the display area AA.

The display panel 120 may be either a top-emission display panel or a bottom-emission display panel depending on the direction in which light emitted from the organic light-emitting element exits.

In the top-emission display panel, the light emitted from the organic light-emitting element exits toward the upper side of the substrate 121 where the organic light-emitting element is formed. When the display panel 120 is the top-emission display panel, a reflective layer may be formed under the anode to propagate the light emitted from the organic light-emitting element toward the upper side of the substrate 121, i.e., the cathode side.

In the bottom-emission display panel, the light emitted from the organic light-emitting element exits toward the lower side of the substrate 121 where the organic light-emitting element is formed. In the bottom-emission display panel, in order to propagate the light emitted from the organic light-emitting element toward the lower side of the substrate 121, the anode may be made only of a transparent conductive material, and the cathode may be made of a metal material having high reflectivity.

In the following description, for convenience of illustration, the display device 100 according to the exemplary embodiment of the present disclosure is a bottom-emission display device. It is, however, to be understood that the present disclosure is not limited thereto.

The encapsulation layer 124 is disposed to cover on the pixel portion 123. The encapsulation layer 124 seals the organic light-emitting element of the pixel portion 123. The encapsulation layer 124 can protect the organic light-emitting element of the pixel portion 123 from the outside moisture, oxygen, impact, etc. The encapsulation layer 124 may be formed by alternately stacking a plurality of inorganic layers and a plurality of organic layers. For example, the inorganic layers may be made of an inorganic material such as silicon nitride (SiNx), silicon oxide (SiOx) and aluminum oxide (AlOx). The organic layer may be made of an epoxy-based or acrylic-based polymer. It is, however, to be understood that the present disclosure is not limited thereto.

The encapsulation substrate 125 is disposed on the encapsulation layer 124. Specifically, the encapsulation substrate 125 is disposed between the encapsulation layer 124 and the back cover 110. The encapsulation substrate 125 can protect the organic light-emitting element of the pixel portion 123 together with the encapsulation layer 124. The encapsulation substrate 125 can protect the organic light-emitting element of the pixel portion 123 from the outside moisture, oxygen, impact, etc. For example, the encapsulation substrate 125 may be made of a material having a high modulus of approximately 200 to 900 MPa. The encapsulation substrate 125 may be made of a metal material such as aluminum (Al), nickel (Ni), chromium (Cr), an alloy material of iron (Fe) and nickel, etc., which is resistant to corrosion and is easy to process into a foil or thin film. As the encapsulation substrate 125 is made of such a metal material, the ultra-thin encapsulation substrate 125 can be implemented, which is resistant to the outside shock, scratches.

The first adhesive layer AD1 is disposed between the encapsulation layer 124 and the encapsulation substrate 125. The first adhesive layer AD1 may attach the encapsulation layer 124 to the encapsulation substrate 125 together. The first adhesive layer AD1 may be made of a material having adhesive properties, and may be a thermally-curable or naturally-curable adhesive. For example, the first adhesive layer AD1 may be made of, but is not limited to, an optical clear adhesive (OCA), a pressure sensitive adhesive (PSA), etc.

The first adhesive layer AD1 may be disposed to surround the encapsulation layer 124 and the pixel portion 123. Specifically, the pixel portion 123 may be sealed by the buffer layer 122 and the encapsulation layer 124, and the encapsulation layer 124 and the pixel portion 123 may be sealed by the buffer layer 122 and the first adhesive layer AD1. The first adhesive layer AD1 can protect the organic light-emitting element of the pixel portion 123 from moisture, oxygen, and impact from outside, along with the encapsulation layer 124 and the encapsulation substrate 125. To this end, the first adhesive layer AD1 may further include a hygroscopic agent. The hygroscopic agent may be hygroscopic particles and can absorb moisture and oxygen from the outside, thereby suppressing the permeation of moisture and oxygen into the pixel portion 123.

A second adhesive layer AD2 is disposed between the encapsulation substrate 125 and the back cover 110. The second adhesive layer AD2 may attach the encapsulation substrate 125 to the back cover 110. The second adhesive layer AD2 may be made of a material having adhesive properties, and may be a thermally-curable or naturally-curable adhesive. For example, the second adhesive layer AD2 may be made of, but is not limited to, an optical clear adhesive (OCA), a pressure sensitive adhesive (PSA), etc.

Although the openings 111 of the back cover 110 are not filled with the second adhesive layer AD2 in the example shown in FIG. 6, the openings 111 of the back cover 110 may be partially or entirely filled with the second adhesive layer AD2. If the inner sides of the openings 111 of the back cover 110 are filled with the second adhesive layer AD2, the contact area between the second adhesive layer AD2 and the back cover 110 is increased, so that it is possible to prevent the separation between the second adhesive layer AD2 and the back cover 110.

Although not shown in the drawings, a polarizing plate may be disposed on the rear surface of the display panel 120. The polarizing plate may selectively transmit light to reduce reflection of external light incident on the display panel 120. Specifically, the display panel 120 may include a variety of metal materials applied to semiconductor elements, lines, organic light-emitting elements, etc. Accordingly, external light incident on the display panel 120 may be reflected off such a metal material, and thus visibility of the display device 100 may be deteriorated due to the reflection of the external light. In this regard, by disposing the polarizing plate, it is possible to prevent the reflection of the external light to increase the outdoor visibility of the display device 100. In some implementations, however, the polarizing plate may be eliminated.

Referring to FIGS. 4, 7 and 8, at least one flexible film 130 is disposed at one end of the display panel 120. For example, one flexible film 130 may be disposed or a plurality of flexible films 130 may be disposed depending on the design choice. In the following description, for convenience of illustration, a plurality of flexible films 130 is disposed. It is, however, to be understood that the number of flexible films 130 may be changed depending on the design choice.

The plurality of flexible films 130 may be electrically connected to the pad area NA1 on one surface of the display panel 120. The plurality of flexible films 130 may be disposed in the pad area NA1 on the surface of the display panel 120 on the substrate 121 and the buffer layer 122. The flexible films 130 may be formed by disposing a variety of elements on a flexible base film so as to transmit signals to the sub-pixels forming the plurality of pixels in the display area AA and the driver circuits. The flexible films 130 may be electrically connected to the display panel 120. The ends of the flexible films 130 may be disposed in the non-display area NA of the display panel 120 to supply the power voltage, the data voltage, etc. to the sub-pixels and the driver circuits in the display area AA.

The driver IC 131 such as the gate driver IC and the data driver IC may be disposed on the flexible films 130. The driver IC 131 is an element for processing data for displaying image and driving signals for processing the data. The driver IC 131 may be disposed by using the chip-on-glass (COG) technique, the chip-on-film (COF) technique, tape carrier package (TCP) technique, etc. Although the driver IC 131 are mounted on the plurality of flexible films 130 by using the chip-on-film (COF) technique for convenience of illustration. It is, however, to be understood that the present disclosure is not limited thereto.

The printed circuit board 140 is disposed from the second support area PA2 of the first back cover 110a to the third support area PA3 of the second back cover 110b and connected to the flexible films 130. The printed circuit board 140 is an element for supplying signals to the driver IC 131. On the printed circuit board 140, a variety of elements for supplying various signals such as driving signals and data signals to the driver IC 131 may be disposed. Although one printed circuit board 140 is shown in FIG. 4, the number of the printed circuit boards 140 is not limited to one but may be variously changed depending on the design choice.

Although not shown in FIG. 4, an additional printed circuit board connected to the printed circuit boards 140 may be further disposed. For example, the printed circuit boards 140 may be referred to as source printed circuit boards (S-PCB) on which the data driver is mounted, and an additional printed circuit board connected to the printed circuit boards 140 may be referred to as a control printed circuit board (C-PCB) on which the timing controller and the like are mounted. The additional printed circuit board may be disposed inside the roller 171, may be disposed in the housing unit HP outside the roller 171, or may be disposed in contact with the printed circuit board 140.

Referring to FIGS. 7 and 8 together, the micro-seal member MS is disposed to cover the plurality of flexible films 130 in the pad area NA1. The micro-seal member MS may be disposed to surround the display area AA in the non-display area NA. The micro-seal member MS may be disposed to surround the side surfaces of the display panel 120, and may be formed in a ring shape conforming to the shape of the display panel 120 when viewed from the top. It is, however, to be understood that the present disclosure is not limited thereto. The micro-seal member MS is disposed to cover the ends of the plurality of flexible films 130 disposed on the substrate 121 and the buffer layer 122 and may overlap the buffer pad BP. The micro-seal member MS may be made of a non-conductive material having elasticity or may be made of a material having adhesive properties.

The micro-seal member MS may further include a hygroscopic agent to reduce moisture permeation through the side portions of the display panel 120. For example, the micro-seal member MS may be made of, but is not limited to, polyimide (PI), polyurethane, epoxy, or an acrylic-based material.

Referring to FIGS. 4 and 7 together, the film cover 150 is disposed from one end of the display panel 120 to the printed circuit board 140 to cover the plurality of flexible films 130 and the pad area NA1. The film cover 150 may cover at least a part of the pad area NA1 and a plurality of flexible films 130 on the opposite surface of the display panel 120. The film cover 150 may be a plastic film having flexibility, for example, and may be made of, but is not limited to, a plastic material such as polyethylene (PE), polyethylene terephthalate (PET), polyvinyl chloride (PVC), polyvinyl alcohol (PVA), polycarbonate (PC), polystyrene (PS) and polyurethane (PUR).

The film cover 150 is extended from the pad area NA1 to the inside of the cover unit 160. One end of the film cover 150 may overlap the pad area NA1, and the other end of the film cover 150 may be extended to the inside of the cover unit 160 to overlap with at least a part of the printed circuit board 140.

The film cover 150 may be fixed to the end of the display panel 120 through the first adhesive member A1. The first adhesive member A1 may be made of a material having adhesive properties, and may be a thermally curable or naturally curable adhesive or a tape including such an adhesive. It is, however, to be understood that the present disclosure is not limited thereto.

The film cover 150 may be fixed inside the cover unit 160 by the cover unit 160. For example, the film cover 150 may be fixed to the inside of the cover unit 160 by a fastening member penetrating the cover unit 160 and the film cover 150. However, the fixing method of the film cover 150 is not limited thereto.

Referring to FIGS. 6 and 7, the cover unit 160 is disposed in the second support area PA2 of the first back cover 110a and the third support area PA3 of the second back cover 110b so that the printed circuit board 140 is accommodated therein. The printed circuit board 140 and a part of the back cover 110 adjacent to the printed circuit board 140 may be inserted into the cover unit 160. The cover unit 160 may be disposed to cover the printed circuit board 140 to protect the printed circuit board 140.

The cover unit 160 may include a base plate 161, a bottom plate 162 and a cover plate 163.

The base plate 161 may be disposed on the opposite surface of the back cover 110. The base plate 161 may be fixed to the second support area PA2 and the third support area PA3 on the opposite surface of the back cover 110 on which the display panel 120 is not disposed. The base plate 161 may overlap the printed circuit board 140 with the back cover 110 therebetween. The base plate 161 may support the printed circuit board 140 disposed between the second support area PA2 and the third support area PA3. For example, the base plate 161 may be made of a material having rigidity to support the second support area PA2, the third support area PA3 and the area between the second support area PA2 and the third supporting PA3 flat. It is, however, to be understood that the present disclosure is not limited thereto.

The bottom plate 162 may be disposed on the surface of the back cover 110. The bottom plate 162 may be disposed to support the printed circuit board 140 disposed on the second support area PA2 and the third support area PA3 of the back cover 110. The bottom plate 162 may be disposed between the printed circuit board 140 and the back cover 110. The bottom plate 162 may have a groove in which the printed circuit board 140 is seated so that the printed circuit board 140 does not fluctuate. In other words, the bottom plate 162 may have a concave portion where the printed circuit board 140 is seated. Accordingly, it is possible to suppress the printed circuit board 140 disposed in the bottom plate 162 from fluctuating so that the printed circuit board 140 can be disposed stably. It is, however, to be understood that the present disclosure is not limited thereto. The bottom plate 162 may be formed flat without any groove.

The cover plate 163 may be disposed on the surface of the back cover 110. The cover plate 163 may be disposed to cover the printed circuit board 140 and may be formed in a convex shape. That is to say, one surface of the cover plate 163 may be formed as a curved surface. The cover plate 163 may be fixed to the third support area PA3 and the base plate 161 on the surface of the back cover 110 on which the display panel 120 and the printed circuit board 140 are disposed. The cover plate 163 may be made of, but is not limited to, a material having rigidity to protect the printed circuit board 140. An end of the film cover 150 may be disposed between the printed circuit board 140 and the cover plate 163.

The cover unit 160 and the back cover 110 may be fixed to each other. For example, the second fastening holes AH2 and the third fastening holes AH3 are formed in the second support area PA2 and the third support area PA3, respectively, and the projections protruding from the base plate 161 or the bottom plate 162 are inserted into the fastening holes AH2 and AH3, so that the cover unit 160, the first back cover 110a and the second back cover 110b can be fixed to one another. In addition, for another example, the cover unit 160 and the back cover 110 may be fixed to each other by fastening members such as screws penetrating through the base plate 161, the bottom plate 162, the cover plate 163 and the back cover 110. The fastening members such as screws may be disposed so that they do not interfere with the printed circuit board 140. It is, however, to be understood that the present disclosure is not limited thereto. The cover unit 160 and the back cover 110 may be fixed in a variety of ways.

Referring to FIGS. 4, 7 and 8, at least one buffer pad BP is disposed on the pad area NA1 of the display panel 120 and is covered with the film cover 150. For example, one buffer pad BP may be disposed or a plurality of buffer pads BP may be disposed depending on the design choice. In the following description, for convenience of illustration, one buffer pad BP is disposed. It is, however to be understood that the number of the buffer pad BP may be changed depending on the design choice. The buffer pad BP may overlap a part of the plurality of flexible films 130 overlapping the display panel 120. The buffer pad BP may overlap with at least a part of the micro-seal member MS covering the plurality of flexible films 130. The buffer pad BP may be disposed between the first adhesive member A1 and the edge of the display panel 120 in the pad area NA1. The buffer pad BP absorbs shock applied to the pad area NA1 connected to the plurality of flexible films 130 while the display device 100 is wound and unwound, so that the pad area NA1 and the plurality of flexible films 130 can be protected. For example, when the display device 100 is wound, the buffer pad BP can protect the pad area NA1 and the plurality of flexible films 130 by mitigating shock applied to a part of the display panel 120 and the back cover 110 wound on the pad area NA1 or the pad area NA1 from the film cover 150. The buffer pad BP may be implemented as a foam tape including bubbles to absorb physical shock. It is, however, to be understood that the present disclosure is not limited thereto.

The buffer pad BP may be fixed to the end of the display panel 120 through the second adhesive member A2. The second adhesive member A2 may be made of a material having adhesive properties, and may be a thermally curable or naturally curable adhesive or a tape including such an adhesive. It is, however, to be understood that the present disclosure is not limited thereto.

When the display unit DP is wound, the cover unit 160 is not bent but maintains its original shape to protect the printed circuit board 140. When the display unit DP is wound, the rigid cover plate 163 of the cover unit 160 is not deformed and maintains its convex shape so that it can protect the printed circuit board 140. The convex cover plate 163 can protect the printed circuit board 140 so that the parts of the back cover 110 and the display panel 120 wound on the cover plate 163 do not apply shock to the printed circuit board 140.

Next, when the display unit DP is wound, the base plate 161 of the cover unit 160 having rigidity is not bent but remains flat to protect the printed circuit board 140. In addition, a portion of the roller 171 around which the base plate 161 is wound may be formed as a flat surface so that the base plate 161 is not bent. For example, the roller 171 may include a first flat portion 171Fa, a second flat portion 171Fb and a curved portion 171R, and the base plate 161 may be seated on the second flat portion 171Fb and thus it can remain flat even when the display unit DP is wound.

The pad area NA1 at the end of the display panel 120 may not be bent when the display unit DP is wound but may maintain its original shape. Specifically, when the display unit DP is wound, the portion of the roller 171 where the portion of the display panel 120 including the pad area NA1 is wound is formed flat, so that the pad area NA1 of the display panel 120 is not bent. For example, the portion of the display panel 120 including the pad area NA1 is seated on the first flat portion 171Fa of the roller 171 to maintain a flat shape even when the display unit DP is wound.

Hereinafter, the display unit DP wound around the roller 171 will be described in detail with reference to FIG. 9.

<Winding of Back Cover and Display Panel>

Figure 9:
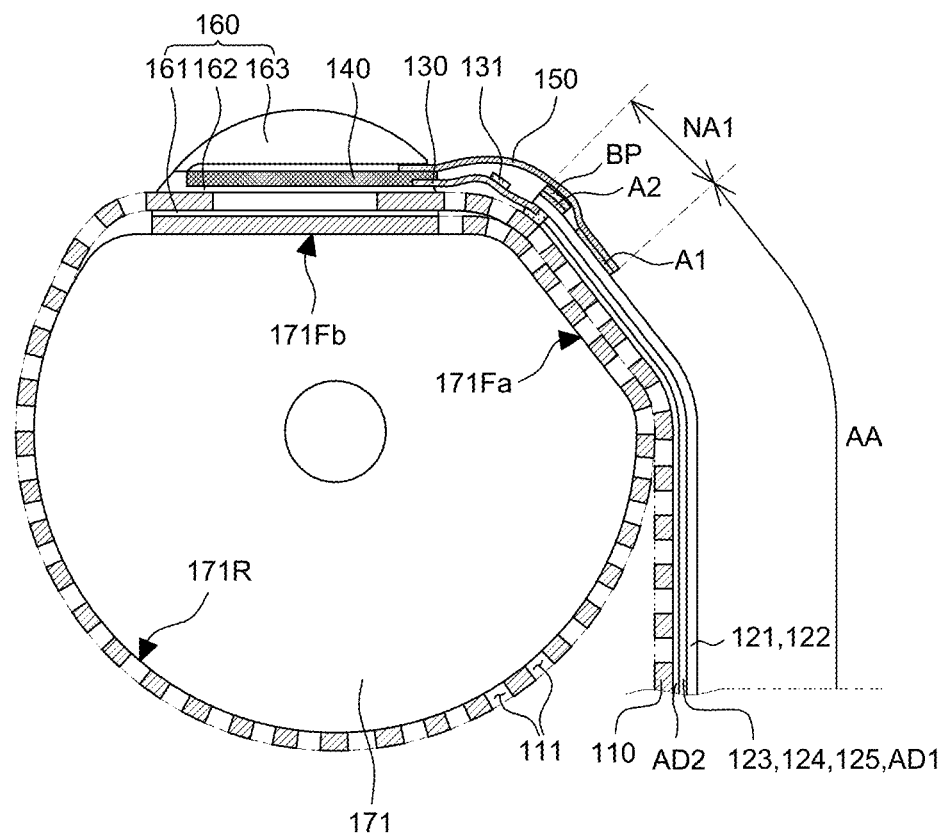
FIG. 9 is a cross-sectional view of a display device according to an exemplary embodiment of the present disclosure.

FIG. 9 is a cross-sectional view of a display device according to an exemplary embodiment of the present disclosure. FIG. 9 is a cross-sectional view showing the second back cover 110b and the second support area PA2 of the first back cover 110a wound around the roller 171.

Referring to FIG. 9, the roller 171 may be formed generally in a cylindrical shape, with a portion of it formed as a flat surface. A part of the outer circumferential surface of the roller 171 is formed as the first flat portion 171Fa and the second flat portion 171Fb, while the rest part of the outer circumferential surface is formed as the curved portion 171R. For example, the second flat portion 171Fb may be extended from the end of the first flat portion 171Fa, and the curved portion 171R may be extended from the other end of the first flat portion 171Fa toward the second flat portion 171Fb.

The first flat portion 171Fa may be an area where a portion of the display panel 120 including the pad area NA1 is wound, and the second flat portion 171Fb may be an area where the printed circuit board 140 and the cover unit 160 are wound and may be extended from the first flat portion 171Fa. The end of the display panel 120 to which the flexible film 130 is electrically connected (or the pad area NA1) may be disposed in line with the first flat portion 171Fa while the printed circuit board 140 may be disposed in line with the second flat portion 171Fb when the display panel 120 and the back cover 110 are fully wound around the roller 171.

The fourth support area PA4 of the second back cover 110b is fastened to one of the first flat portion 171Fa and the second flat portion 171Fb of the roller 171. For example, the fourth support area PA4 may be fastened to the first flat portion 171Fa of the roller 171, or may be fastened to the second flat portion 171Fb of the roller 171. In the following description, it is assumed that that the fourth support area PA4 of the second back cover 110b is fastened to the second flat portion 171Fb. It is, however, to be understood that the present disclosure is not limited thereto.

The fourth support area PA4 of the second back cover 110b may be wound on the second flat portion 171Fb of the roller 171, and the second malleable area MA2 extended from the fourth support area PA4 may be wound on the first flat portion 171Fa and the curved portion 171R.

In addition, the third support area PA3 extended from the second malleable area MA2 may be wound on the fourth support area PA4 wound on the second flat portion 171Fb. Like the third support area PA3, the second support area PA2 of the first back cover 110a may also be wound on the fourth support area PA4 wound on the second flat portion 171Fb.

Next, a portion of the first malleable area MA1 extended from the second support area PA2 may be wound on the second malleable area MA2 wound on the first flat portion 171Fa.

The second support area PA2, the third support area PA3 and the area between the second support area PA2 and the third support area PA3 on which the cover unit 160 and the printed circuit board 140 are wound on the second flat portion 171Fb of the roller 171, and thus the printed circuit board 140 and the cover unit 160 can remain flat.

Since the portion of the display panel 120 including the pad area NA1 connected to the plurality of flexible films 130 is wound on the first flat portion 171Fa of the roller 171, the portion of the display panel 120 including the pad area NA1 can remain flat.

If a portion of the display panel 120 including the pad area NA1 is wound on the curved portion 171R, shock may be applied to the woundpad area NA1 and the flexible films 130 connected to the pad area NA1 due to repetitive winding and unwinding. As a result, contact failure between the pad area NA1 and the flexible films 130 may occur. In view of the above, in order for the portion of the display panel 120 including the pad area NA1 to remain flat, the area for the first flat portion 171Fa is obtained to reduce damage to the display panel 120 and the flexible films 130.

Accordingly, the pad area NA1 of the display panel 120, at least a part of the flexible films 130, the printed circuit board 140 and the cover unit 160 can remain flat irrespectively of whether the display unit DP is wound or unwound, and thus it is possible to reduce damage to the pad area NA1 and the printed circuit board 140 which may occur when they are bent.

In addition, since the plurality of flexible films 130 and the film cover 150 are formed to be longer than the straight line distance between the display panel 120 and the printed circuit board 140 so as not to be in tight contact with the back cover 110, it is possible to reduce damage at the boundary between the first flat portion 171Fa and the second flat portion 171Fb due to the radius of curvature. Specifically, the length of the film cover 150 and the plurality of flexible films 130 may be larger than the straight line distance between the display panel 120 and the printed circuit board 140. The length of the plurality of flexible films 130 may be larger than the distance from the edge of the display panel 120 to the edge of the printed circuit board 140. Therefore, as shown in FIG. 7, when the display unit DP is fully unwounded, the plurality of flexible films 130 may not be in tight contact with the second support area PA2. As shown in FIG. 9, even when the display unit DP is wound, the flexible films 130 are not in tight contact with the back cover 110, and thus they can be bent with a radius of curvature larger than the radius of curvature of the first flat portion 171Fa and the second flat portion 171Fb.

If the length of the flexible films 130 and the film cover 150 is equal to the length between the edge of the printed circuit board 140 and the edge of the display panel 120, the flexible films 130 and the film cover 150 may be in tight contact with the back cover 110. When the display unit DP is wound, the flexible films 130 and the film cover 150 may be bent along the radius of curvature of the first flat portion 171Fa and the second flat portion 171Fb, and thus the stress applied to the flexible films 130 and the film cover 150 may increase. Accordingly, the lengths of the flexible films 130 and the film cover 150 are formed to be larger than the straight line distance between the display panel 120 and the printed circuit board 140, so that the flexible films 130 and the film cover 150 are not in tight contact with the back cover 110, thereby mitigating the stress applied to the flexible films 130.

In addition, the length of the part of the film cover 150 disposed between the display panel 120 and the printed circuit board 140 may be larger than the length of the part of the flexible films 130 disposed between the display panel 120 and the printed circuit board 140. The film cover 150 has the length larger than the straight line distance between the display panel 120 and the printed circuit board 140 and the length of the flexible films 130, so that the flexible films 130 are not pressed and the pad area NA1 of the display panel 120 is not pulled when the display device 100 is wound. If the length of the part of the film cover 150 overlapping between the display panel 120 and the printed circuit board 140 is equal to the straight line distance between the display panel 120 and the printed circuit board 140, the film cover 150 wound with the radius of curvature larger than the back cover 110 pulls the pad area NA1 or presses the plurality of flexible films 130 and thus the display panel 120 and the flexible films 130 may be damaged. Accordingly, by making the length of the film cover 150 larger, it is possible to reduce the stress applied to the film cover 150 when the display device 100 is wound, and thus damage to the display panel 120 and the flexible film 130 due to the stress of the film cover 150 can be reduced.

The display device 100 according to the exemplary embodiment of the present disclosure can increase the area of the portions of the display panel 120 which remain flat when the display unit DP is wound, so that damage to the display panel 120 and the flexible films 130 can be reduced. Specifically, two flat portions 171Fa and 171Fb are formed at the roller 171, and the printed circuit board 140 is disposed on the second flat portion 171Fb, so that the space can be obtained where the pad area NA1 and the portion of the display panel 120 adjacent to the pad area NA1 can be wound on the first flat portion 171Fa. On the first flat portion 171Fa, only the portion of the display panel 120 including the pad area NA1 may be wound, and other elements such as the printed circuit board 140 and the cover unit 160 are not disposed. Accordingly, when the display unit DP is wound around the roller 171, the pad area NA1 and the portion of the display panel 120 extended from the pad area NA1 can maintain flat shape, and stress transmitted from the remaining portion of the display panel 120 wound on the curved portion 171R to the pad area NA1 can be reduced. Therefore, the display device 100 according to the exemplary embodiment of the present disclosure is designed so that only the display panel 120 including the pad area NA1 is wound on the first flat portion 171Fa, and thus the area of the flat portions of the display panel 120 can be increased. In addition, stress transmitted to the pad area NA1 can be reduced, thereby reducing damage to the pad area NA1 and the flexible films 130.

In the display device 100 according to an exemplary embodiment of the present disclosure, the film cover 150 is disposed, and thus the plurality of flexible films 130 can be protected while the area of the display panel 120 wound on the first flat portion 171Fa can be increased. When the display unit DP is wound, the display panel 120 and the other part of the back cover 110 may be wound on the plurality of flexible films 130 and the pad area NA1. At this time, by disposing the film cover 150 covering the plurality of flexible film 130 and the pad area NA1, the rear surface of the other part of the back cover 110 and the plurality of flexible films 130 do not interference with each other. In doing so, by using a first adhesive member A1 instead of fastening members such as screws that reduces the area of the display panel 120 wound on the first flat portion 171Fa, it is possible to simplify the fixing structure of the film cover 150. Since the film cover 150 is a light flexible film made of a plastic-based material, it is possible to easily fix it on the display panel 120 by simply using the first adhesive member A1 instead of members such as screws. Since the film cover 150 can be easily fixed on the display panel 120 without using separate screws, it is possible to protect the flexible films 130 and the pad area NA1 by disposing the film cover 150 without reducing the area of the display panel 120 wound on the first flat portion 171Fa.

In addition, in the display device 100 according to the exemplary embodiment of the present disclosure, the film cover 150 having the length larger than the straight line distance between the display panel 120 and the printed circuit board 140 and the length of the plurality of flexible films 130 are disposed, so that damage to the plurality of flexible films 130 and the pad area NA1 by the film cover 150 may be reduced. Specifically, the film cover 150 has the length larger than the length of the plurality of flexible films 130, so that the flexible films 130 are not in tight contact with the film cover 150 when the display unit DP is wound. The length of the part of the film cover 150 overlapping between the printed circuit board 140 and the display panel 120 may be larger than the length of the part of the flexible films 130 overlapping between the printed circuit board 140 and the display panel 120. Therefore, when the display unit DP is wound, the film cover 150 is not in tight contact with the flexible films 130 because the film cover 150 has the length larger than the length of the flexible films 130. In addition, because the length of the part of the film cover 150 overlapping between the display panel 120 and the printed circuit board 140 is larger than the straight line distance between the display panel 120 and the printed circuit board 140, the film cover 150 may not be in tight contact with the roller 171, tension may not be applied to the pad area NA1. Accordingly, in the display device 100 according to the exemplary embodiment of the present disclosure, the length of the film cover 150 is larger than the length of the plurality of flexible films 130, so that it is possible to reduce stress generated when the film cover 150 is brought into tight contact with the flexible films 130 while the display unit DP is wound or to suppress the stress transmitted to the pad area NA1.

In the display device 100 according to the exemplary embodiment of the present disclosure, the buffer pad BP is disposed to absorb shock applied to the pad area NA1 and the plurality of flexible films 130 and to protect the pad area NA1 and the flexible films 130. The buffer pad BP implemented as a foam tape is disposed between the film cover 150 and the pad area NA1 to absorb physical shock. In addition, the buffer pad BP is disposed to overlap the pad area NA1 and the plurality of flexible films 130 to absorb shock applied to the pad area NA1 and the plurality of flexible films 130. If the buffer pad BP is not disposed, when the display unit DP is wound, shock may be transmitted to the pad area NA1 where the flexible films 130 are bonded from the portion of the display panel 120, the portion of the back cover 110 or the film cover 150 which are wound on the pad area NA1. As a result, the pad area NA1 and the plurality of flexible films 130 may be damaged. Accordingly, in the display device 100 according to the exemplary embodiment of the present disclosure, the buffer pad BP is disposed on the pad area NA1 so that it overlaps the flexible films 130, to absorb shock applied to the pad area NA1 and protect the pad area NA1 and the flexible films 130.

In the display device 100 according to the exemplary embodiment of the present disclosure, the first flat portion 171Fa and the second flat portion 171Fb of the roller 171 are separately formed, where the portion of the display panel 120 including the pad area NA1 and the printed circuit board 140 are seated, respectively, so that the area of the flat portions of the display panel 120 and the design margin for the printed circuit board 140 can be obtained. The area where the portion of the display panel 120 including the pad area NA1 and the printed circuit board 140 are disposed can be increased when the roller 171 includes the first flat portion 171Fa where the portion of the display panel 120 including the pad area NA1 is seated and the second flat portion 171Fb where the printed circuit board 140 is seated, compared to when the roller 171 including a single flat portion. If only one flat portion is formed at the roller 171, the size of the printed circuit board 140 has to be reduced according to the area of the flat portion, and the area of the portion of the display panel 120 wound on the flat portion may be reduced. Accordingly, in the display device 100 according to the exemplary embodiment of the present disclosure, the first flat portion 171Fa and the second flat portion 171Fb are formed separately, so that the area of the flat portions of the display panel 120 can be increased when the display unit DP is wound, and the design margin for the printed circuit board 140 can be obtained.

<Film Cover>

Figure 10:
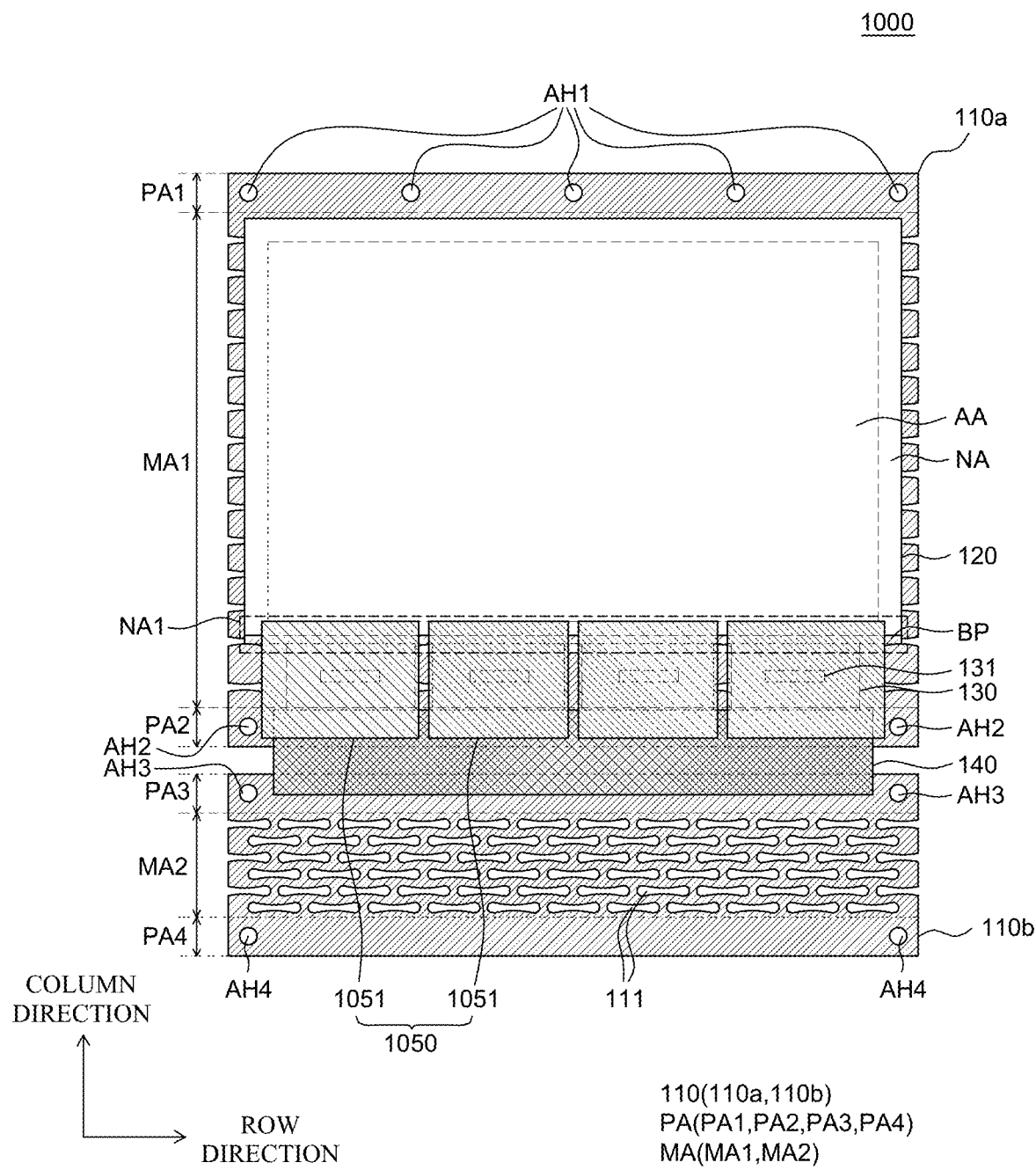
FIG. 10 is a plan view of a display unit of a display device according to another exemplary embodiment of the present disclosure.

FIG. 10 is a plan view of a display unit of a display device according to another exemplary embodiment of the present disclosure. A display device 1000 shown in FIG. 10 is substantially identical to the display device 100 shown in FIGS. 1 to 9 except that a film cover 1050 includes a plurality of first film covers 1051; and, therefore, the redundant description will not be made.

Referring to FIG. 10, the film cover 1050 includes a plurality of first film covers 1051. The plurality of first film covers 1051 may be associated with the plurality of flexible films 130, respectively. The first film covers 1051 may cover the flexible films 130, respectively. Although the first film covers 1051 have a larger width than that of the flexible films 130 in the example shown in FIG. 10, the present disclosure is not limited thereto. The width of the first film covers 1051 may be equal to the width of the flexible films 130.

In the display device 1000 according to this exemplary embodiment of the present disclosure, the first film covers 1051 spaced apart from one another so that they are associated with the flexible films 130, respectively, thereby increasing the efficiency of dissipating heat. When the display device 1000 is driven, heat may be generated from the driver IC 131 of the plurality of flexible films 130. In order to efficiently release such heat generated from the driver IC 131, the film covers 1050 consists of the plurality of first film covers 1051, which is to protect the flexible films 130 and the pad area NA1. The plurality of first film covers 1051 may be disposed so that they are associated with the plurality of flexible films 130, respectively, to protect the plurality of flexible films 130. In addition, the first film covers 1051 are spaced apart from one another, like the plurality of flexible films 130. Accordingly, the heat generated from the driver IC 131 of the plurality of flexible films 130 may be released between the plurality of first film covers 1051 spaced apart from one another, and the efficiency of dissipating heat and the reliability of the plurality of flexible films 130 can be improved.

Figure 11:
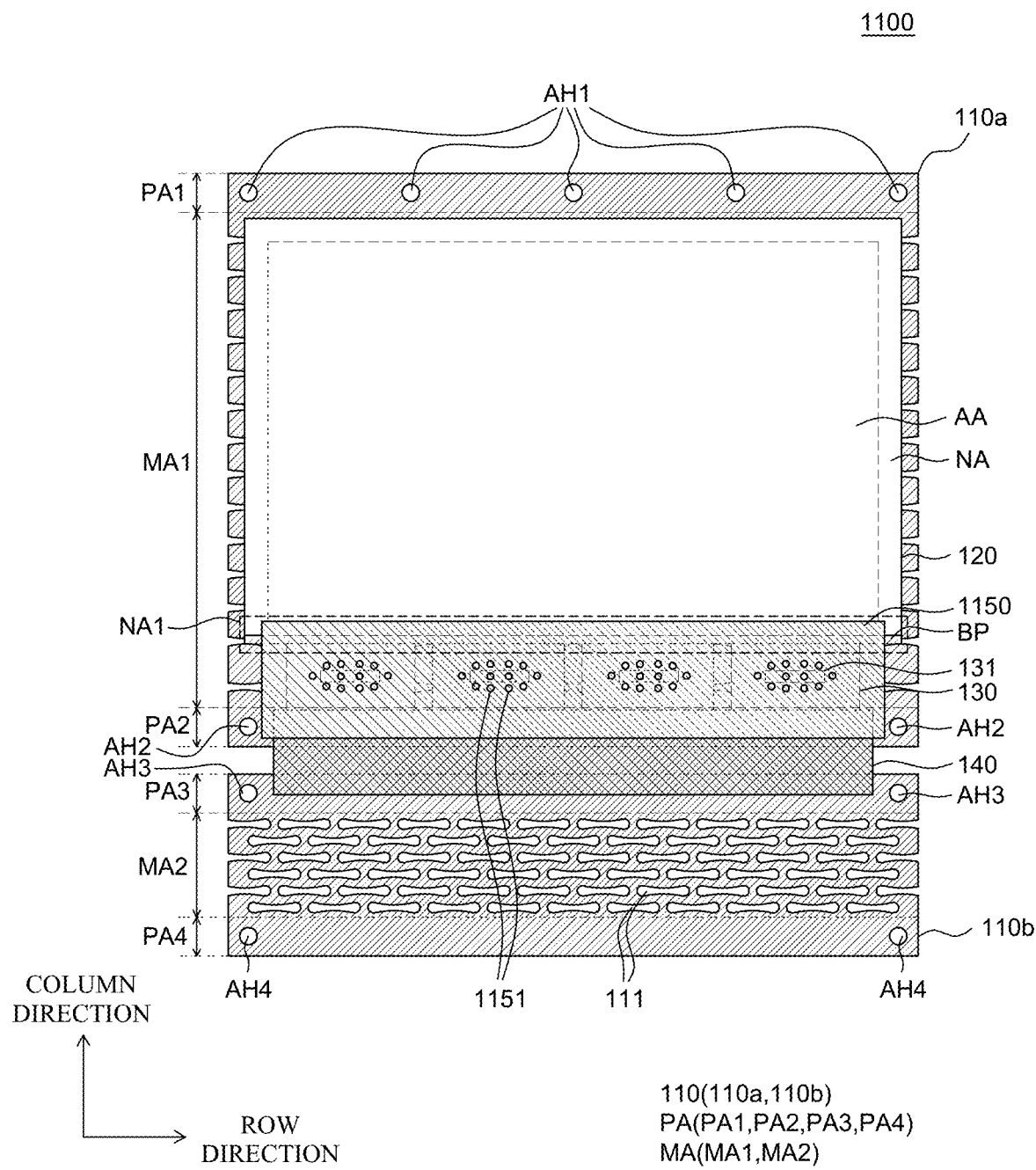
FIG. 11 is a plan view of a display unit of a display device according to yet another exemplary embodiment of the present disclosure.

FIG. 11 is a plan view of a display unit of a display device according to yet another exemplary embodiment of the present disclosure. A display device 1100 shown in FIG. 11 is substantially identical to the display device 100 shown in FIGS. 1 to 9 except that a film cover 1150 includes a plurality of holes 1151; and, therefore, the redundant description will not be made.

Referring to FIG. 11, the film cover 1150 includes a plurality of holes 1151. The plurality of holes 1151 may be disposed to overlap at least the driver IC 131 of the plurality of flexible films 130, respectively. The holes 1151 may be disposed to overlap the driver IC 131, and heat generated from the driver IC 131 may be released through the holes 1151. Although the holes 1151 are arranged to overlap the driver IC 131 in the example shown in FIG. 11, the holes 1151 may be arranged in all or part of the film cover 1150, and the arrangement of the holes 1151 is not limited thereto.

In the display device 1100 according to this exemplary embodiment of the present disclosure, by disposing the film cover 1150 where the holes 1151 overlapping the driver IC 131 of the flexible films 130 are formed, it is possible to increase the efficiency of dissipating heat. When the film cover 1150 covering the plurality of flexible films 130 is disposed in order to protect the plurality of flexible films 130, it may be difficult to release the heat generated by the driver IC 131 to the outside. If the heat generated from the driver IC 131 is not properly released, performance of the driver IC 131 may be deteriorated. To overcome this, the plurality of holes 1151 is formed in at least a part of the film cover 1150 overlapping the driver IC 131 to effectively release the heat generated from the driver IC 131. In the display device 1100 according to this exemplary embodiment of the present disclosure, by forming the holes 1151 in the portion of the film cover 1150 overlapping the driver IC 131, it is possible to increase the efficiency of dissipating heat and the reliability of the flexible films 130.

In the display device 1100 according to this exemplary embodiment of the present disclosure, the plurality of holes 1151 is formed in the film cover 1150 so that the film cover 1150 can be deformed, and it is possible to prevent slip between the film cover 1150 and the first adhesive members A1. When the display unit DP is wound or unwound, stress may be applied to the film cover 1150. As the plurality of holes 1151 formed in the film cover 1150 is flexibly deformed, it is possible to mitigate the stress applied to the film cover 1150, the pad area NA1 of the display panel 120 connected to the film cover 1150 and the flexible film 130. For example, when stress to deform the film cover 1150 in the vertical direction is applied, the holes 1151 of the film cover 1150 are deformed and thus the stress is less transmitted to the display panel 120 and the flexible films 130. In addition, as the holes 1151 of the film cover 1150 are deformed, slip between the first adhesive member A1 that attaches the film cover 1150 to the display panel 120 and the film cover 1150 can be reduced as well. Accordingly, as the holes 1151 are deformed while the display unit DP is wound, the stress applied to the elements in the vicinity of the film cover 1150 from the film cover 1150 can be mitigated, and slip between the film cover 1150 and the first adhesive member A1 can be suppressed.

<Buffer Pad>

Figure 12:
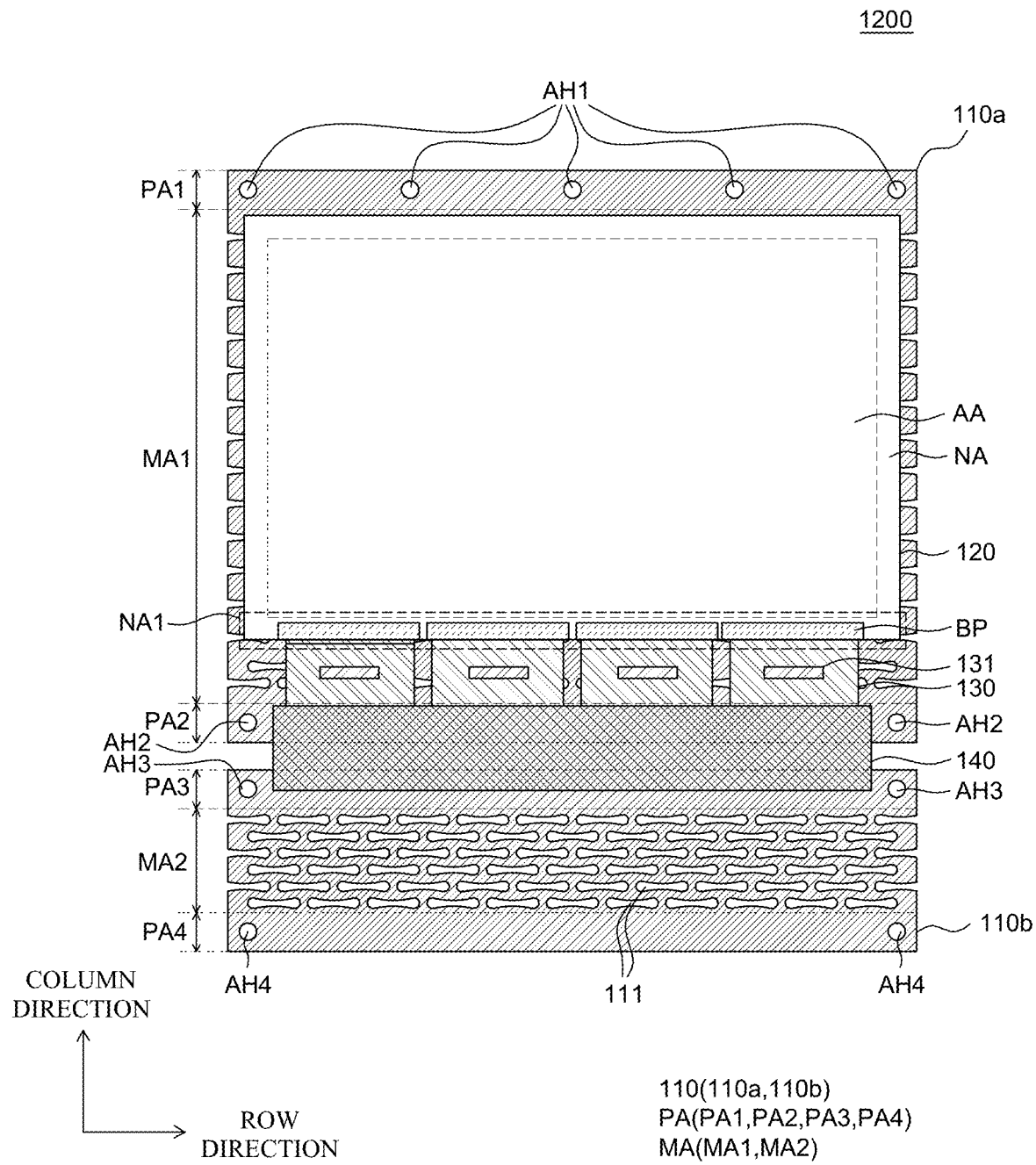
FIGS. 12 to 14 are views for illustrating buffer pads of display units of display devices according to a variety of exemplary embodiments of the present disclosure.
Figure 13:
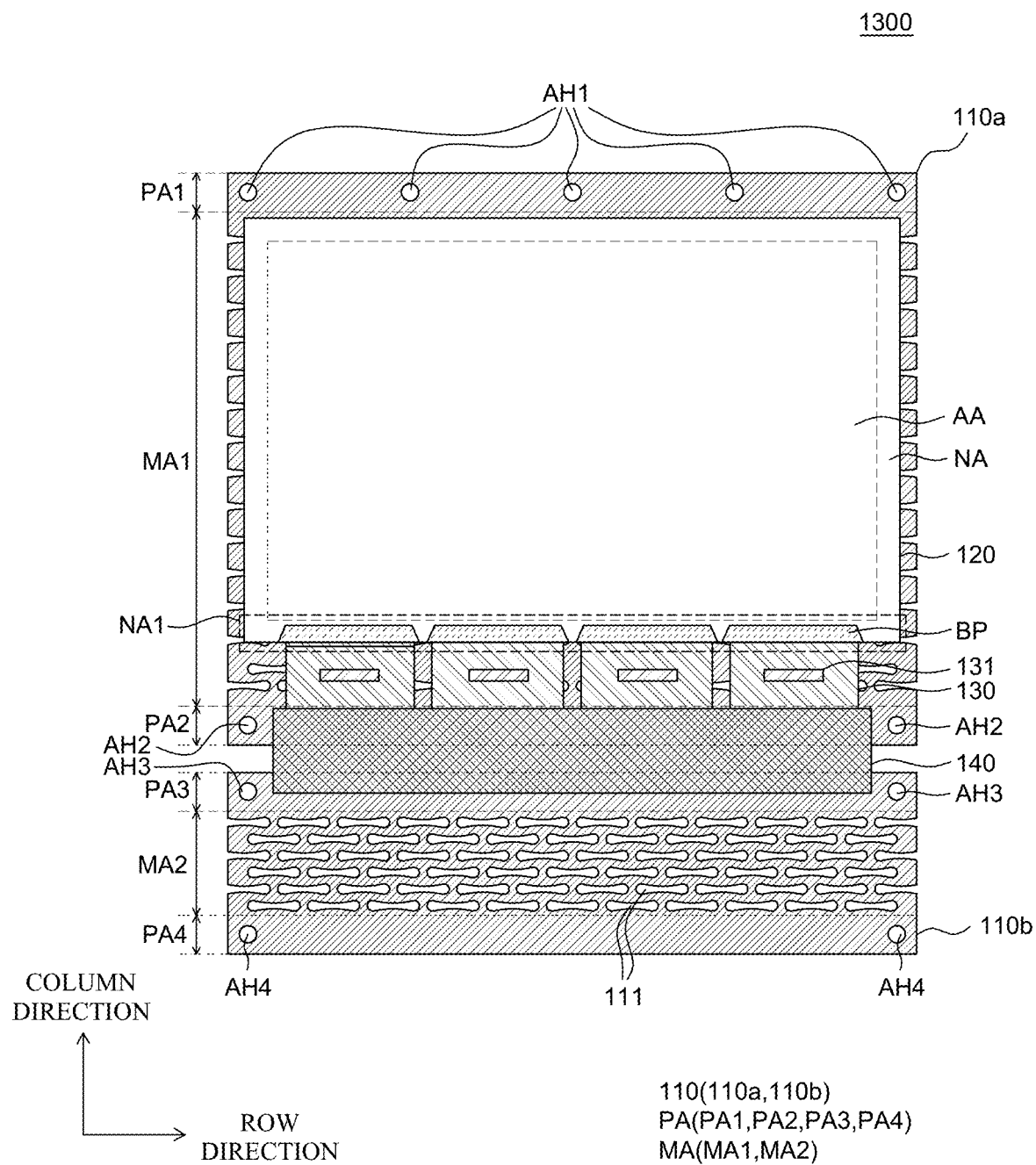
Figure 14:
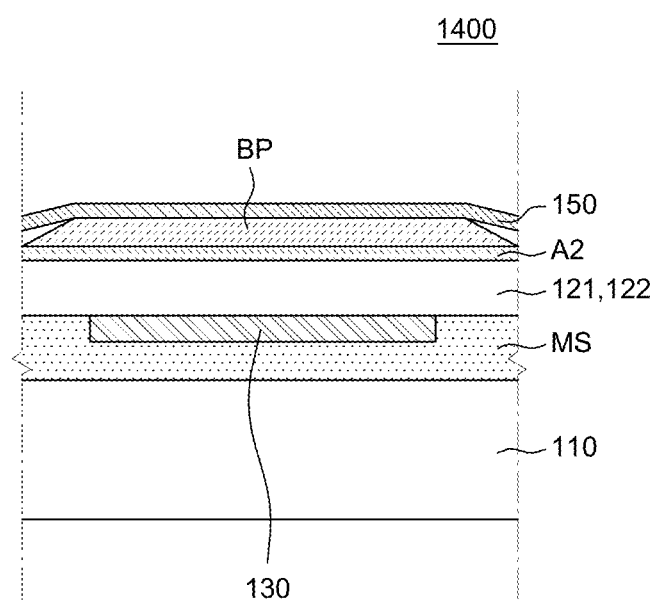

FIGS. 12 to 14 are views for illustrating buffer pads of display units of display devices according to a variety of exemplary embodiments of the present disclosure. Specifically, FIG. 12 is a plan view of a display unit DP of a display device 1200 according to yet another exemplary embodiment. FIG. 13 is a plan view of a display unit DP of a display device 1300 according to yet another exemplary embodiment. FIG. 14 is an enlarged, cross-sectional view of a display unit DP of a display device 1400 according to yet another exemplary embodiment of the present disclosure. Display devices 1200, 1300, and 1400 shown in FIGS. 12 to 14 are substantially identical to the display device 100 shown in FIGS. 1 and 9 except for buffer pads BP; and, therefore, the redundant description will not be made. In FIGS. 12 and 13, the film cover 150 is not depicted for convenience of illustration.

Referring to FIG. 12, a plurality of buffer pads BP may be disposed to overlap the plurality of flexible films 130, respectively. The plurality of buffer pads BP disposed on the pad area NA1 of the display panel 120 overlap at least the flexible films 130, respectively, and it is possible to mitigate shock transmitted to a part of the pad area NA1 connected to the flexible films 130.

Referring to FIG. 13, a plurality of buffer pads BP may be formed in a shape having the width decreasing away from the portions overlapping the plurality of flexible films 130. The width of the portions of the plurality of buffer pads BP protruding out of the flexible films may be increased toward the edge of the display panel 120. For example, the plurality of buffer pads BP may have a shape with the width increasing toward the edge of the display panel 120 from the inside of the display panel 120 when viewed from the top.

Referring to FIG. 14, a plurality of buffer pads BP may have a cross-sectional shape having the width decreasing away from the portions overlapping the plurality of flexible films 130. The plurality of buffer pads BP may have a shape having a thickness decreasing from the inside to the edge. For example, the plurality of buffer pads BP may have a trapezoidal shape having a thickness decreasing from the inside toward the edge.

In the display devices 1200, 1300 and 1400 according to the exemplary embodiments of the present disclosure, the plurality of buffer pads BP are arranged so that they are associated with the flexible films 130, respectively, and thus it is possible to mitigate shock applied to the flexible films 130 and the pad area NA1. If a shock is applied to the pad area NA1 of the display panel 120, especially the pad area NA1 overlapping the flexible films 130 when the display unit DP is wound, there may be a contact failure between the display panel 120 and the flexible films 130. Accordingly, the plurality of buffer pads BP is arranged to overlap at least the plurality of flexible films 130 in the pad area NA1, it is possible to mitigate shock applied to the flexible films 130 and the pad area NA1. Accordingly, the plurality of buffer pads BP is arranged in the portion of the pad area NA1 overlapping the plurality of flexible films 130 which is sensitive to shock, it is possible to efficiently absorb shock applied to the flexible films 130 and the pad area NA1. Accordingly, in the display devices 1200, 1300 and 1400 according to the exemplary embodiments of the present disclosure, the plurality of buffer pads BP is disposed in the portion of the pad area NA1 overlapping the flexible films 130 which is sensitive to shock, it is possible to suppress cracks in the pad area NA1 and a contact failure between the flexible films 130 and the pad area NA1.

In the display devices 1200, 1300 and 1400 according to the exemplary embodiments of the present disclosure, the plurality of buffer pads BP have a shape having a width decreasing away from the portion overlapping the flexible films 130, so that the shock applied to the plurality of buffer pads BP can be dispersed, and the delamination between the flexible films 130 and the display panel 120 can be reduced. For example, as shown in FIGS. 13 and 14, the plurality of buffer pads BP have the portions protruding out of the flexible films 130, so that the shock from the outside is not concentrated on the flexible films 130 but may be dispersed through the portions of the buffer pads BP. In addition, the pad area NA1 near the edge of the display panel 120 is a point to which the plurality of flexible films 130 is bonded. The width of the plurality of buffer pads BP is the largest near the edge of the display panel 120 to which the plurality of flexible films 130 is bonded, so that the plurality of flexible films 130 are supported such that they are not separated from the display panel 120. In the display devices 1200, 1300 and 1400 according to the exemplary embodiments of the present disclosure, the plurality of buffer pads BP may have a variety of shapes, so that they can disperse shock applied to the flexible films 130 and can support the flexible film 130.

The exemplary embodiments of the present disclosure can also be described as follows:

According to an aspect of the present disclosure, there is provided a display device. The display device includes a display panel, a back cover supporting the display panel on a rear surface of the display panel, one or more flexible films electrically connected to one end of the display panel and disposed on a surface of the back cover, a film cover covering the one or more flexible films and the end of the display panel, a printed circuit board electrically connected to the one or more flexible films and disposed on the surface of the back cover, and a roller comprising a first flat portion, a second flat portion and a curved portion. The display panel and the back cover are wound around or unwound from the roller. The end of the display panel is disposed in line with the first flat portion while the printed circuit board is disposed in line with the second flat portion when the display panel and the back cover are fully wound around the roller.

The film cover may include a plurality of holes overlapping a driver IC of the one or more flexible films.

The film cover may further include a plurality of first film covers located so that they are associated with the one or more flexible films, respectively.

The display device may further include one or more buffer pad disposed between the end of the display panel and the film cover. The one or more buffer pad may overlap the one or more flexible films.

A width of the one or more buffer pad may decrease away from a portion overlapping the one or more flexible films.

A thickness of the one or more buffer pad may decrease from its inside to its edge.

The display device may further include a first adhesive member disposed between the display panel and the film cover, and a second adhesive member disposed between the display panel and the one or more buffer pad.

The display device may further include a cover plate covering the printed circuit board on the surface of the back cover and having a curved surface. An end of the film cover may be disposed between the printed circuit board and the cover plate.

A length of a portion of the film cover disposed between the display panel and the printed circuit board and a length of a portion of the one or more flexible films disposed between the display panel and the printed circuit board may be larger than a straight line distance between the display panel and the printed circuit board.

According to another aspect of the present disclosure, there is a display device. The display device includes a display panel comprising a pad area, one or more flexible films electrically connected to the pad area on a surface of the display panel, a printed circuit board electrically connected to the one or more flexible films, a back cover supporting the display panel, the one or more flexible films and the printed circuit board, a film cover covering at least a part of the pad area and the one or more flexible films on an opposite surface of the display panel, a cover unit in which the printed circuit board and a part of the back cover overlapping the printed circuit board are inserted, and a roller comprising a first flat portion in line with the pad area and a second flat portion in line with the printed circuit board and extended from the first flat portion. The display panel and the back cover are wound around or unwound from the roller.

A length of a portion of the film cover disposed between the display panel and the printed circuit board may be larger than a length of a portion of the one or more flexible films disposed between the display panel and the printed circuit board.

The display device may further include one or more buffer pad disposed between the pad area and the film cover, a first adhesive member attaching the film cover to the display panel, a second adhesive member attaching the one or more buffer pad to the display panel, and a micro-seal member covering the one or more flexible films overlapping the pad area. The one or more buffer pad may overlap at least a part of the micro-seal member.

A portion of the one or more buffer pad may protrude out of the one or more flexible films.

The film cover may include a plurality of holes overlapping a driver IC of the one or more flexible films.

A length of a portion of the film cover disposed between the display panel and the printed circuit board and a length of a portion of the one or more flexible films disposed between the display panel and the printed circuit board may be larger than a straight line distance between the display panel and the printed circuit board.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a display panel;
   a back cover supporting the display panel on a rear surface of the display panel;

one or more flexible films electrically connected to one end of the display panel and disposed on a surface of the back cover;
a film cover covering the one or more flexible films and the end of the display panel;
a printed circuit board electrically connected to the one or more flexible films and disposed on the surface of the back cover; and
a roller comprising a first flat portion, a second flat portion and a curved portion, wherein the display panel and the back cover are wound around or unwound from the roller,
wherein the end of the display panel is disposed in line with the first flat portion while the printed circuit board is disposed in line with the second flat portion when the display panel and the back cover are fully wound around the roller.

2. The display device of claim 1, wherein the film cover comprises a plurality of holes overlapping a driver IC of the one or more flexible films.

3. The display device of claim 1, wherein the film cover further comprises a plurality of first film covers located so that they are associated with the one or more flexible films, respectively.

4. The display device of claim 1, further comprising:
one or more buffer pad disposed between the end of the display panel and the film cover,
wherein the one or more buffer pad overlaps the one or more flexible films.

5. The display device of claim 4, wherein a width of the one or more buffer pad decreases away from a portion overlapping the one or more flexible films.

6. The display device of claim 4, wherein a thickness of the one or more buffer pad decreases from its inside to its edge.

7. The display device of claim 4, further comprising:
a first adhesive member disposed between the display panel and the film cover; and
a second adhesive member disposed between the display panel and the one or more buffer pad.

8. The display device of claim 1, further comprising:
a cover plate covering the printed circuit board on the surface of the back cover and having a curved surface,
wherein an end of the film cover is disposed between the printed circuit board and the cover plate.

9. The display device of claim 1, wherein a length of a portion of the film cover disposed between the display panel and the printed circuit board and a length of a portion of the one or more flexible films disposed between the display panel and the printed circuit board is larger than a straight line distance between the display panel and the printed circuit board.

10. A display device, comprising:
a display panel comprising a pad area;
one or more flexible films electrically connected to the pad area on a surface of the display panel;
a printed circuit board electrically connected to the one or more flexible films;
a back cover supporting the display panel, the one or more flexible films and the printed circuit board;
a film cover covering at least a part of the pad area and the one or more flexible films on an opposite surface of the display panel;
a cover unit in which the printed circuit board and a part of the back cover overlapping the printed circuit board are inserted; and
a roller comprising a first flat portion in line with the pad area and a second flat portion in line with the printed circuit board and extended from the first flat portion,
wherein the display panel and the back cover are wound around or unwound from the roller.

11. The display device of claim 10, wherein a length of a portion of the film cover disposed between the display panel and the printed circuit board is larger than a length of a portion of the one or more flexible films disposed between the display panel and the printed circuit board.

12. The display device of claim 10, further comprising:
one or more buffer pad disposed between the pad area and the film cover;
a first adhesive member attaching the film cover to the display panel;
a second adhesive member attaching the one or more buffer pad to the display panel; and
a micro-seal member covering the one or more flexible films overlapping the pad area,
wherein the one or more buffer pad overlaps at least a part of the micro-seal member.

13. The display device of claim 12, wherein a portion of the one or more buffer pad protrudes out of the one or more flexible films.

14. The display device of claim 10, wherein the film cover comprises a plurality of holes overlapping a driver IC of the one or more flexible films.

15. The display device of claim 10, wherein a length of a portion of the film cover disposed between the display panel and the printed circuit board and a length of a portion of the one or more flexible films disposed between the display panel and the printed circuit board is larger than a straight line distance between the display panel and the printed circuit board.

* * * * *